(12) United States Patent
Yuda et al.

(10) Patent No.: US 8,065,120 B2  
(45) Date of Patent: Nov. 22, 2011

(54) SUPPORT SYSTEM

(75) Inventors: Shinya Yuda, Hitachi (JP); Norito Watanabe, Hitachi (JP); Shigetoshi Sakimura, Hitachi (JP); Shunsuke Minami, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 458 days.

(21) Appl. No.: 12/180,497

(22) Filed: Jul. 25, 2008

(65) Prior Publication Data

US 2009/0037156 A1 Feb. 5, 2009

Related U.S. Application Data

(63) Continuation of application No. 11/105,566, filed on Apr. 6, 2005, now Pat. No. 7,409,324.

(30) Foreign Application Priority Data

Apr. 8, 2004 (JP) ................................ 2004-113935  
Mar. 15, 2005 (JP) ................................ 2005-072165

(51) Int. Cl.  
*G06F 17/50* (2006.01)  
*G06F 17/27* (2006.01)

(52) U.S. Cl. ................. 703/2; 704/9; 707/100; 714/728

(58) Field of Classification Search ............. 703/2, 17; 704/9; 707/100; 714/728; 709/229  
See application file for complete search history.

(56) References Cited

U.S. PATENT DOCUMENTS

| | | | |
|---|---|---|---|
| 5,163,016 A | 11/1992 | Har'El et al. | 716/5 |
| 6,473,794 B1 * | 10/2002 | Guheen et al. | 709/223 |
| 6,615,166 B1 * | 9/2003 | Guheen et al. | 703/27 |
| 6,889,275 B2 | 5/2005 | Vandecappelle et al. | 710/107 |
| 7,167,865 B1 | 1/2007 | Tharp et al. | 707/100 |
| 2004/0078742 A1 | 4/2004 | Emek et al. | 714/728 |
| 2005/0010386 A1 * | 1/2005 | Tharp et al. | 703/13 |

OTHER PUBLICATIONS

M. Fuse, et al., "Production Engineering Knowledge Bases and Process Improvements", Precision Eng. vol. 68, No. 4, pp. 507-510, (2002).

* cited by examiner

*Primary Examiner* — Thai Phan  
(74) *Attorney, Agent, or Firm* — Volpe and Koenig, P.C.

(57) ABSTRACT

The design support system regarding the present invention comprises a node data storage means that stores node data to generate functional models which present a group of function nodes which are functions divided from performance function of apparatus which is an objective to be designed and a group of part nodes which realize the functions in mutual relations, a functional model generating means that generates the functional models in reference to the node data storage means, a node designation receiving means that receives the designation of a node among the functional models, a node selection means that selects a node which has a mutual relation with nodes to which the designation are given, a display unit that displays the node selected by the node selection means.

20 Claims, 33 Drawing Sheets

FIG.6

Validation Record Data

| | | |
|---|---|---|
| 340a | Validation Record ID | E1 |
| 340b | Objective Function ID | F1 |
| 340c | Validation Data | **Year **Month |
| 340d | Validation Term | **Hours |
| 340e | Validation Method | Simulation |
| 340f | Validatoin Conditions | *** |
| 340g | Validation Results | *** |

FIG.10

| Function | | Purge gas | |
|---|---|---|---|
| Target Specifications | | purge volume | 10cc/sec~15cc/sec |
| | | ⋮ | ⋮ |
| Operation Condition | | Outside Temperature | 0 deg to 40 deg |
| | | Wind Speed | less than 5 meter/sec |
| | | ⋮ | ⋮ |
| Validation Content | Validation Record 1 | Validation Item : confirm gas purging rate | |
| | | Validation Data | **Year **Month |
| | | Validation Term | **Hours |
| | | Validation Method | Simulation |
| | | Validation Conditions | *** |
| | | Validation Conclusion | *** |
| | ⋮ | | |

FIG.12A

```
Validation Item List
   conform wind break effect
   -confirm gas purge rate
   —confirm flammable ready to be ignited
   confirm regulation Capability of flint wheel
   -confirm revolution Capability of flint wheel
   —confirm ignition Capability
   ——confirm lightening Capability
```

FIG.12B

```
Validation Item List
   conform wind break effect
   -confirm gas purge rate ⇒ Cancel Validation : within Allowance of Parameter
   confirm regulation Capability of flint wheel
   -confirm revolution Capability of flint wheel ⇒ Cancel Validation : Already have been done
```

FIG.16
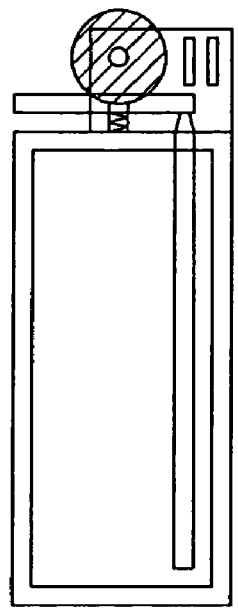
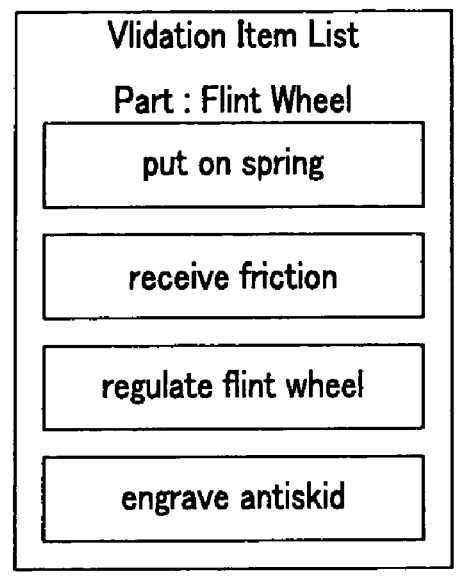

FIG.18
Part : P1                    Operation Condition List
Design Parameter 1  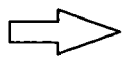  | ○ | Operation Condition 1 |
| ○ | Operation Condition 2 |
|   | Operation Condition 3 |
| ⋮ |
Function : F1                Operation Condition List
Target Specifications 1    |   | Operation Condition 1 |
|   | Operation Condition 2 |
|   | Operation Condition 3 |
| ⋮ |
| ○ | Operation Condition 9 |

FIG.19
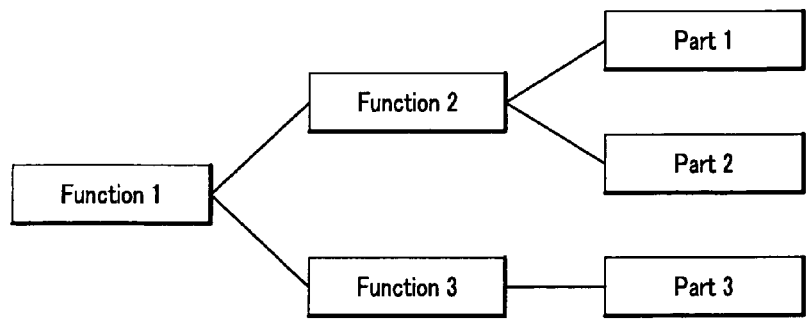
Functional Model
---
Function Validation Model
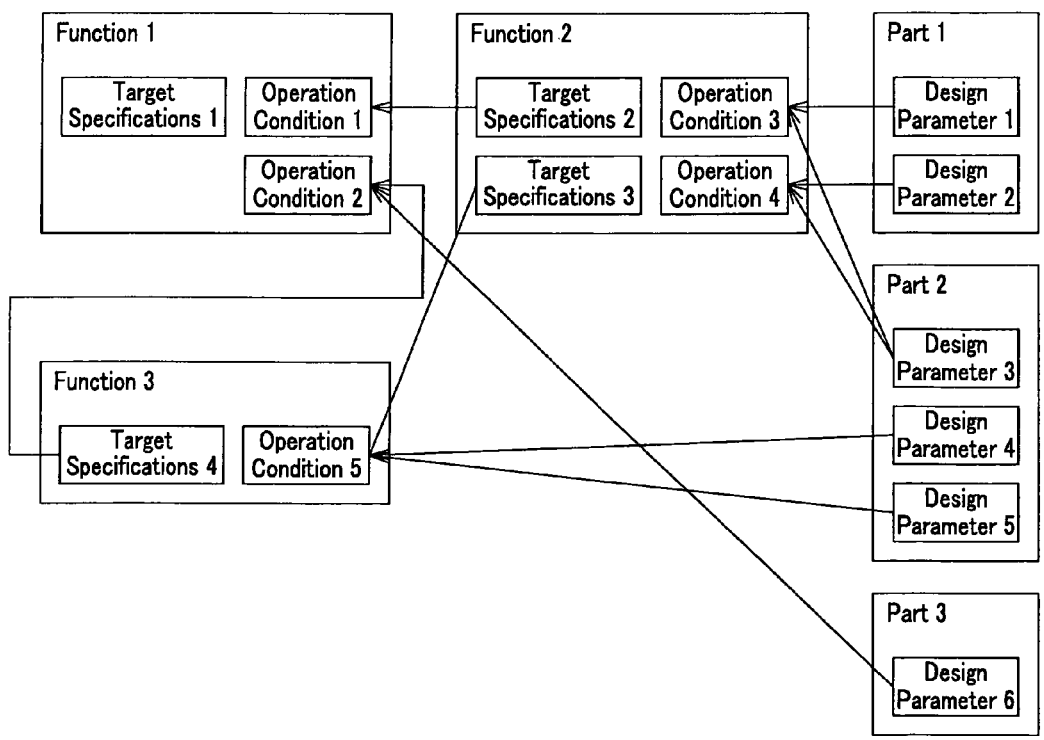

FIG.22

Function 2

| | |
|---|---|
| | Target Parameter 2 |
| ○ | Target Parameter 3 |
| ○ | Operation Parameter 3 |
| | Operation Parameter 4 |

FIG.24

| Graphics | List Format |

List of Validation Items

| Validation Items (Function・Part) | status | reasons |
|---|---|---|
| maintain axial rotation | not validated | |
| generate axial rotation | largely | |
| maintain shape | medium | |
| | | |
| | | |
| | | |
| | | |

FIG.25

| | Changing Purpose | Part : Gear | Parameter : Thickness | | |
|---|---|---|---|---|---|
| | Function Validation Items | Parameters to be changed | Parameters to be fixed | Importance | |
| 1 | avoid friction | gear thickness safety rate | material | | |
| 2 | maintain strength | gear thickness safety rate | material | | |
| 3 | fix to shaft | screw setting torque | screw specifications | | |
| | | | | | |
| | | | | | |

FIG. 30
Function Model
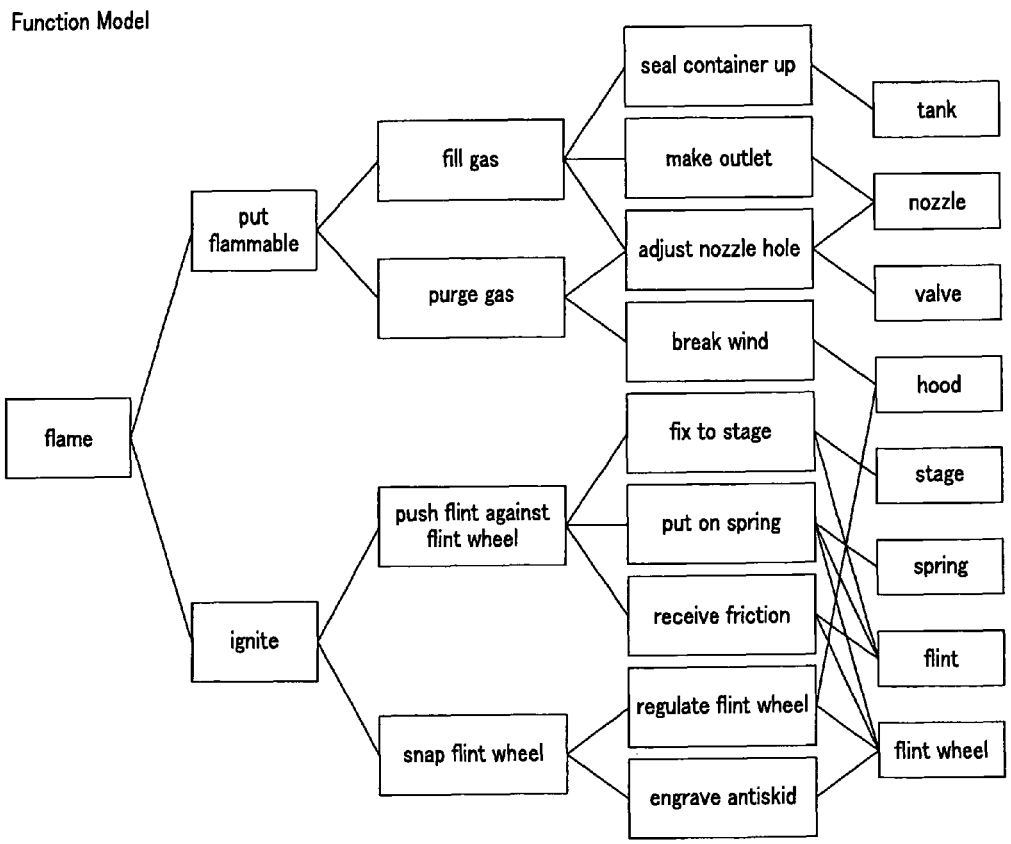
Function Validation Model
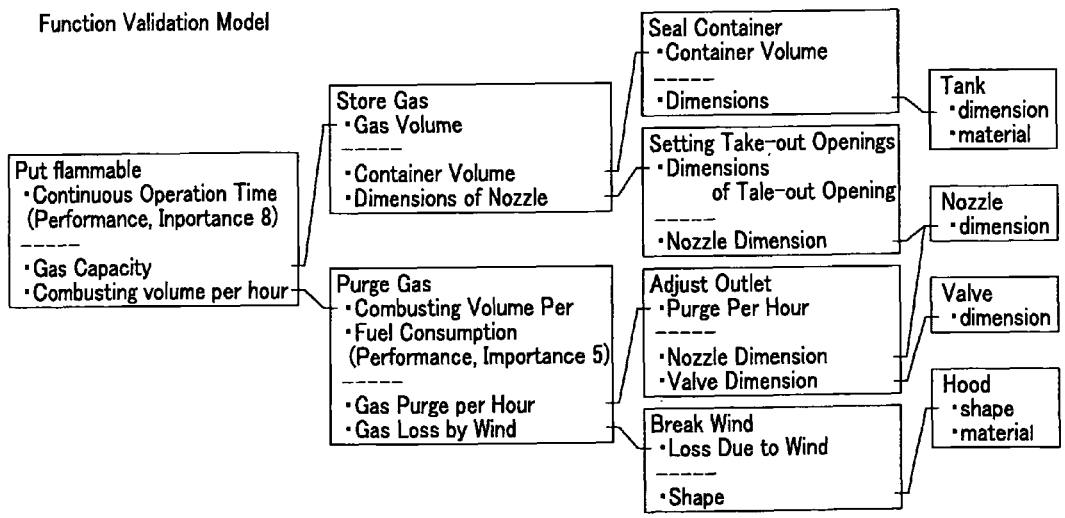

FIG.31

| 1 | put flammable |
|---|---|
| 2 | purge gas |
| 3 | store gas |
| 4 | asjust nozzle hole |
| 5 | break wind |
| 6 | seal container up |
| 7 | make outlet |

FIG.32

| 1 | Valve |
|---|---|
| 2 | Hood |
| 3 | Tank |
| 4 | Nozzle |

FIG.34

| 1 | Hood |
| 2 | Bread wind |
| 3 | Purge gas |
| 4 | Adjust nozzle hole |
| 5 | Valuve |
| 6 | Nozzle |

FIG.35

| 1 | Hood |
| 2 | Valve |
| 3 | Nozzle |

SUPPORT SYSTEM

CROSS-REFERENCE TO RELATED APPLICATIONS

This application is a continuation of application Ser. No. 11/105,566, filed on Apr. 6, 2005, and claims the benefit of priority under 35 USC 119 of Japanese Patent Application No. 2004-113935, filed on Apr. 8, 2004, and Japanese Patent Application No. 2005-072165, filed on Mar. 15, 2005. The entire contents of these applications is incorporated herein by reference.

FIELD OF INVENTION

The present invention relates to a system to support the assistance necessary for the task operation regarding the equipment design. Especially this support system is to assist the designer in exactly specifying the objects to be validated.

It is quite necessary to validate the design in the various check points in designing the equipment in order to prevent field failures after production and in-market. For the design validation, it is necessary to obtain and comprehend the past field modes and effects, review actual failures and analyze the mechanical construction in details. According to the conclusion of such analytical study and validation, it is further necessary to determine and specify the design parameters of all components and parts which compose each structures of the equipment.

In general this analytical study and validation (we call "design validation", hereinafter) are left for the skill of design engineers. Therefore, the product quality of the equipment depends on the depth and the extended degree of the study that the design engineer has done. In order to prevent such influence of the pre-studied level by the design engineers or their experiences, the consistent design quality is maintained by using a specific design rule, a design manual, a documented design text and a check list and by practicing design reviews.

As one of methodologies for the systematically practicing of the design validation, a method that exploits functional ontology has been proposed as described in the reference 1.

This method is to describe the products by the functions not by the components or parts, specify the functions in the elemental requirements and review the predicted problems and alternative solutions in realizing such elemental requirements in the functions. Especially, this is a significant method to review the design of new products in the aspects of analyzing the future possible problems and countermeasures for the problems and/or studying to realize the products in alternative structures.

Reference 1:
"Production Engineering Knowledge Bases and Process Improvements", M. Fuse, M. Kashiwase, Y. Kitamura and R. Mizoguchi, Precision Eng., Vol. 68, No. 4 PP. 507-510 (2002)

The methodology proposed in the reference 1 can be applicable to studying the functionality which corresponds to the conceptual design of the equipment but not to detailed-designing such as changing the specifications of the equipment or changing components or parts to be used the actual products.

For example, the effects or the influences in changing components or parts, such as how such engineering changes influence the operation or the function of other components or parts and the functions and/or performances of the overall systems are important information particularly in detailed design.

However, the methodology proposed in the reference 1 does not have such an implementation to obtain the useful information.

The method, as proposed in the reference, that exploits functional ontology, the hierarchal relation in the functionalities can be described but not the mutual relation of the functionalities. It is not possible to specify or exact the effects or ancillary influences to other functionalities or functions by using the method.

For example, the technology proposed in the reference 1 cannot survey or provide the items that have no relations with the causality of the functionality such as the validation of the functionality of stiffness for the case when the thickness of the material that composes the parts, the confirmation of the functionality (such as a functionality to fix the parts) of the further by-effects due to the reduction of the thickness of the material and the by-effect against the vibration modes.

BRIEF SUMMARY OF THE INVENTION

The present invention relates to the design of the equipment, especially is, for the purpose of facilitating to determine the validation objectives in the design changing.

There are two major design changes. One is to change the apparent specifications and the other to change the implementation design. Taking a gas lighter as an example, the former corresponds to the change of the performance in service continuity for lightening and the latter to the change of the physical dimensions of the fuel tank or the material of the flint roller.

The necessity of the apparent design change is from the market requirement if it relates to the apparent specifications of the consumer precuts (such as the users are general consumers) and from the customer requirements for the purpose of engineering performance improvement if it is a part to be used for the assembly of other components (such as an automobile part or an electronics part). On the other hands, the implementation design change is from the supply shortage of the existing part or the production cost down.

What so ever, the designer has less flexibility in directly changing the performance in designing products. The only portions that the designer can directly change are the s physical dimensions or the materials of the parts that compose the final products and he completes to fulfill the designated performances by various trials. For example, it is quite natural that he changes the volume of the fuel tank of the lighter in order to change the performance of the service continuity for lightening or the fuel consumption per unit time. This designer change can be realized by the modification of the physical dimensions of the fuel tank or a fuel nozzle.

Therefore, there are variations in the approach to change the designs if they are required, depending on the kinds of the design changes. When he tries to change the performances, he first considers the design items which he is allowed to directly change and the items, parts and physical dimensions that influence to the performances. The designer tends to consider the design modification that has least influences to the overall performances if the implementation design change is required.

Especially, the parts that are influenced by changing a certain part in the product are called susceptive parts, which the designers are careful to discover over the parts composed into the product. A simple example is that the change of the physical dimension of a certain part causes the necessity to change the physical dimension of another component to which the certain part is installed in.

There is an existing method such that when the design parameters of the parts that compose equipment are changed the method isolates the influence against other composing parts. However the kinds of the design change is not incorporated in the existing method and it have been necessary to re-evaluate the results of the selected design change with depending on the performance design changes or the implementation design changes The other objective of the present invention is to determine the influence caused by changing the composing parts and the design parameters with depending on the kinds of design changes.

BRIEF DESCRIPTION OF THE DRAWINGS

FIG. 6 is a schematic that shows an example of data structure of the validation record data which the validation record data DB 340 manages.

FIG. 10 is a schematic that shows an example of detailed function information graphic presentation when the "detail presentation" icon is clicked under the selection of "purge a gas" as for the function node.

FIG. 12A is a schematic that shows an example of the graphic presentation when "validation item presentation" icon is clicked.

FIG. 12B is a schematic that shows an example of the graphic presentation when "validation item presentation" icon is clicked.

FIG. 16 is an example of the schematic that shows a flint wheel is selected for a part.

FIG. 18 is a schematic that shows a graphic presentation to receive the designation of the operation parameters which make relations of the models therein.

FIG. 19 is an example of the schematic that shows the function validation model.

FIG. 22 is a schematic that shows the graphic presentation to direct the whether each parameter is to be changed or not.

FIG. 24 is a schematic that shows a graphic presentation of a validation item list.

FIG. 25 is a schematic that shows an example of the validation item list stored if a "store" icon.

FIG. 30 is another schematic that shows an example of a function validation model.

FIG. 31 is an output of a performance realizing method retrieval process.

FIG. 32 is another output of a performance realizing method retrieval process.

FIG. 34 is a schematic that shows an output of a process of influence range restriction retrieval.

FIG. 35 is a schematic that shows another output of a process of influence range restriction retrieval.

DETAILED DISCRIPTION OF THE INVENTION

The design support system regarding the present invention that solves the above problems is constructed with several major means.

More concretely, the design support system regarding the present invention comprises a node data storage means that stores node data to generate functional models which present a group of function nodes which are functions divided from performance function of apparatus which is an objective to be designed and a group of part nodes which realize the functions in mutual relations, a functional model generating means that generates the functional models in reference to the node data storage means, a node designation receiving means that receives the designation of a node among the functional models, a node selection means that selects a node which has a mutual relation with nodes to which the designation are given, a display unit that displays the node selected by the node selection means.

As for these nodes, the mutual relation can be a relation presented with hierarchical layers.

The part nodes that the node data storage means stores have parameters regarding one or more design and each of the function nodes has parameters regarding one or more operations and target specifications.

The design support system further comprises a parameter relation information storage means that stores parameter relation information that defines paring of parameters and a function validation model generating means that generates function validation model that shows a relation among parameters included in nodes in reference to the parameter relation information storage means.

The present invention will be explained in details in the embodiments using drawings.

Figure 1:
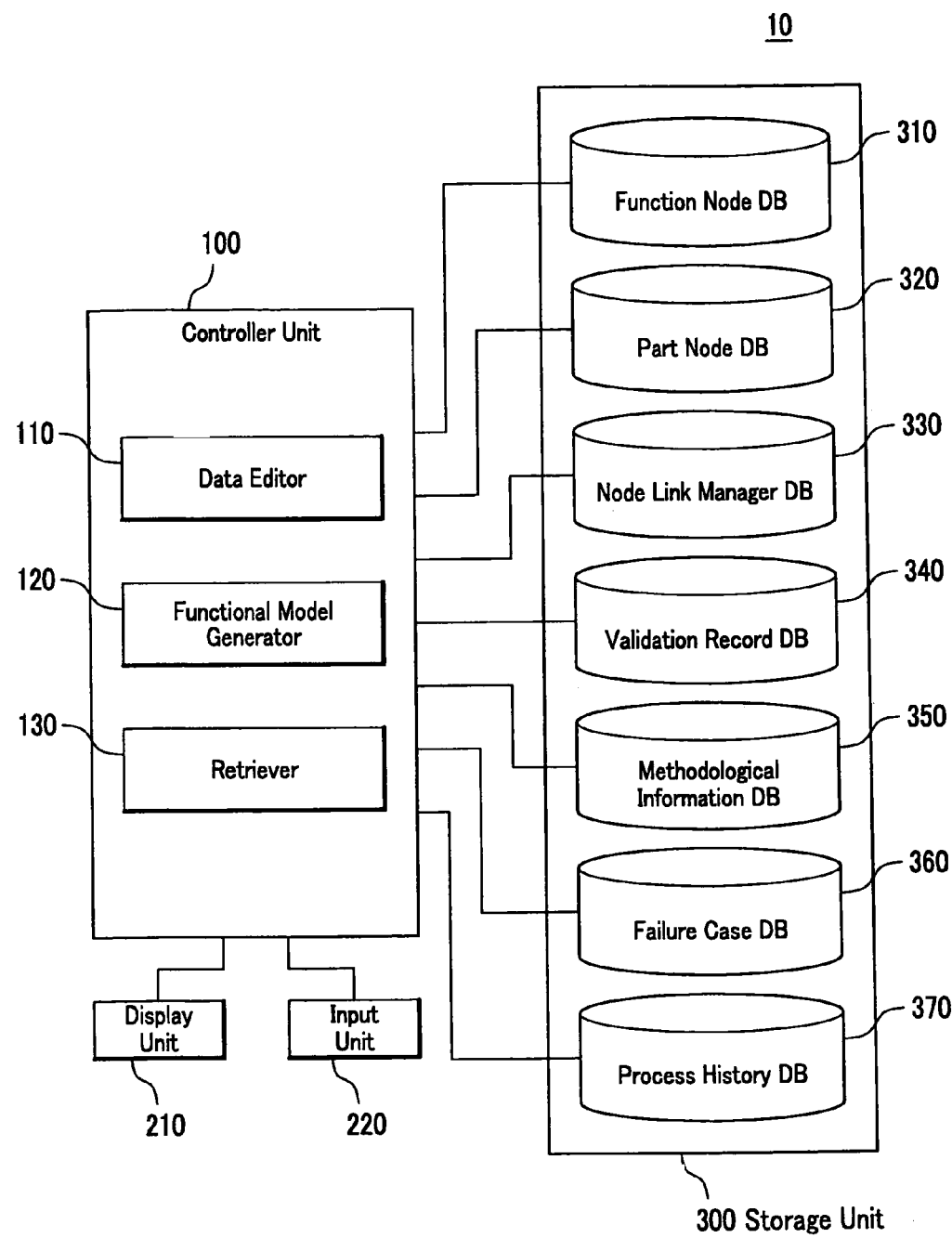
FIG. 1 is a block diagram that shows an example of construction of the design support system of an embodiment regarding the present invention.

The FIG. 1 shows a block diagram that shows an example of construction of the design support system 10 of an embodiment regarding the present invention. The design support system comprises a controller unit 100, a display unit 210, input unit 220 and a storage unit 300.

The controller unit 100 can be constructed by an information processor device, such as a PC or a general purpose server computer, which equips a central processor (CPU), a main memory devices, a communication controller to make a linkage with networks and data input device to read the removable media as CD-ROM, DVD-ROM. The basic system to construct the controller unit 100 can be realized with other implementation. For example, a dedicated unit for the design support system can be constructed.

The controller unit 100 has particular featuring function units as a data editor 110, a functional model generator 120 and a retriever 130.

The data editor 110 allows the user to generate and/or edit various data to be used and handled in the design support system 10. The functional model generator 120 is to generate functional models (as described later) based on the various data stored in the storage unit 300. The retriever 130 is to retrieve the information regarding the functional models according to the command given by the operator.

The processing parts such as a data editor 110, a functional model generator 120 and a retriever 130 are implemented by various computer programs which are loaded in the main memory and are executed with incorporation with the CPU, in a fashion of virtual processing parts executing in the information processing unit. It is possible to store the programs that allow the information processing to function as the controller unit 100 for the design support system 10, in the storage unit 300. It is also possible to store these programs in CD-ROM and/or DVD-ROM and release them into the commercial market. The programs recorded in the removable media are read by using the data read out units and installed in the information. It is also possible to install the programs through the communication channels.

The display unit 210 is constructed with a display devices and the input unit 220 with a mouse, keyboard and other input devices.

The storage unit 300 can be constructed with the hard disk drives and stores the various data to be used for the design support system 10 in a form of data base (abbreviated as DB). For the present embodiment, the storage unit 300 stores a function node DB 310, a part node DB 320, a node link manager. DB 330, a validation record DB 340, a methodological information DB 350, a failure case DB 360 and a process history DB 370.

Figure 2:
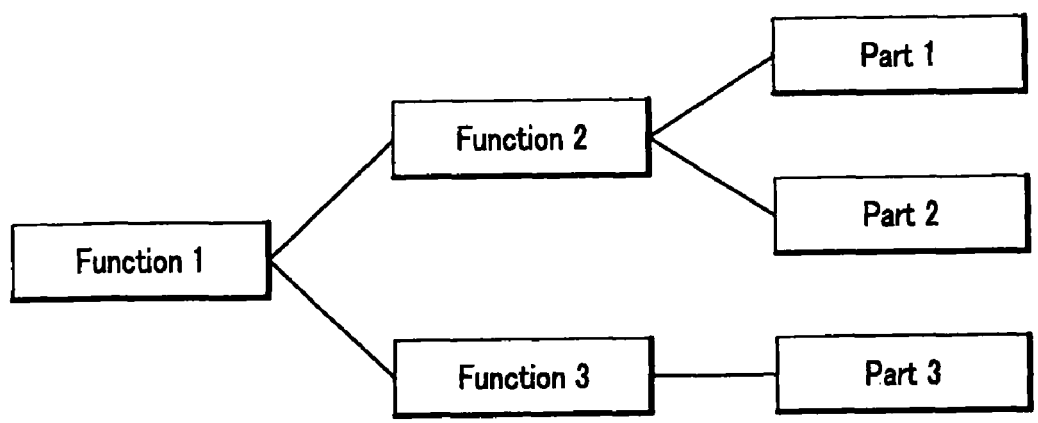
FIG. 2 is a schematic that shows a relation among functional models.

The function node DB 310 is a data base that manages the data regarding the function nodes that construct the functional models. The functional model is such a model that shows a correspondence to the parts necessary for ultimately realizing the functionality of the equipment to be designed, of which parts fulfill the final elementary functions which are hierarchically cascaded down from the major target function of the equipment. For example, the cascade structure is shown as in FIG. 2. For this example, "function 1" is the major target function and is cascaded down to the next hierarch as "function 2" and "function 3". The figure shows the parts that fulfill the "function 2" are "part 1" and "part 2" and the part that fulfills the "function 3" is "part 3". The blocks as "function 1" and "function 2" given in a conceptual idea s are called function node. The blocks as the "part 1" and the "part 2" are called "part node". Further discussion will be given by using an example of a lighter.

Figure 3:
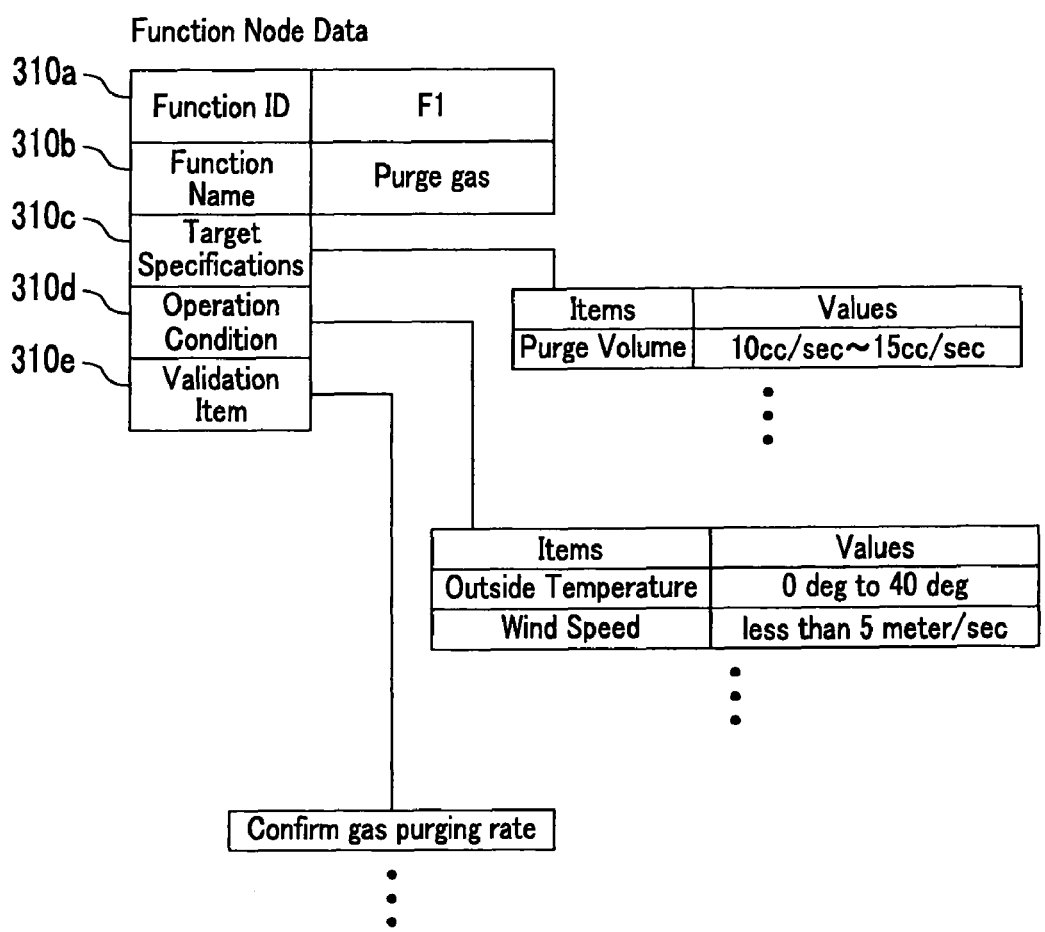
FIG. 3 is a schematic that shows an example of data structure of the function node data which the function node DB (an abbreviation of "data base") 310 manages.

FIG. 3 shows an example of the data construction of function node data which the function node DB 31 includes therein. As shown in FIG. 3, the function node data is composed of a unit record consisting of a function ID 310a, a function name 310b, target specifications 310c, operation conditions 310d and validation items 310e.

The target specifications 310c include the items for the specifications and the plural specific values to prescribe each of the items and determine the input conditions for the function. The validation items 310e have plural items necessary to review the functionality.

The function node data are generated in correspondence to the equipment which is a design objective. The designer can execute the generation and the edition of the function node data by using the data editor 110.

Figure 4:
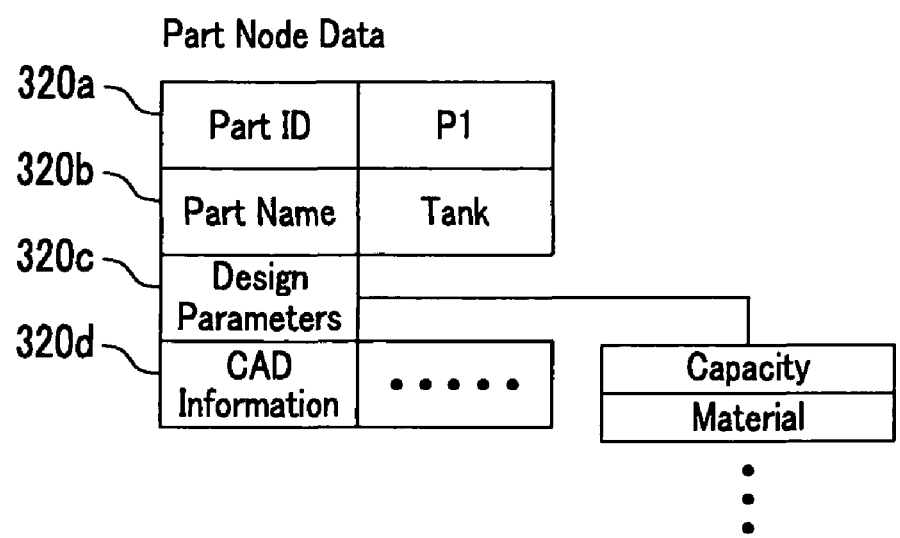
FIG. 4 is a schematic that shows an example of data structure of the part node data which the part node DB 320 manages.

FIG. 4 shows an example of the data construction of the part node data which the part node DB 320 manages. As shown in FIG. 4, the part node data manage a part ID 320a, a part name 320b, a design parameter 320c and the CAD information 320d are given as in on record.

The design parameter 320c is the parametric values to be considered for the design of the part and store the plural values therein. The CAD information 320d stores the data necessary for the graphical presentation of the parts in a part of the equipment which is the design objective to be graphically presented as well.

The part node data are generated in correspondence to the equipment which is the design objective. The operator can execute the generation and edition of the part node data by using the data editor 110.

Figure 5:
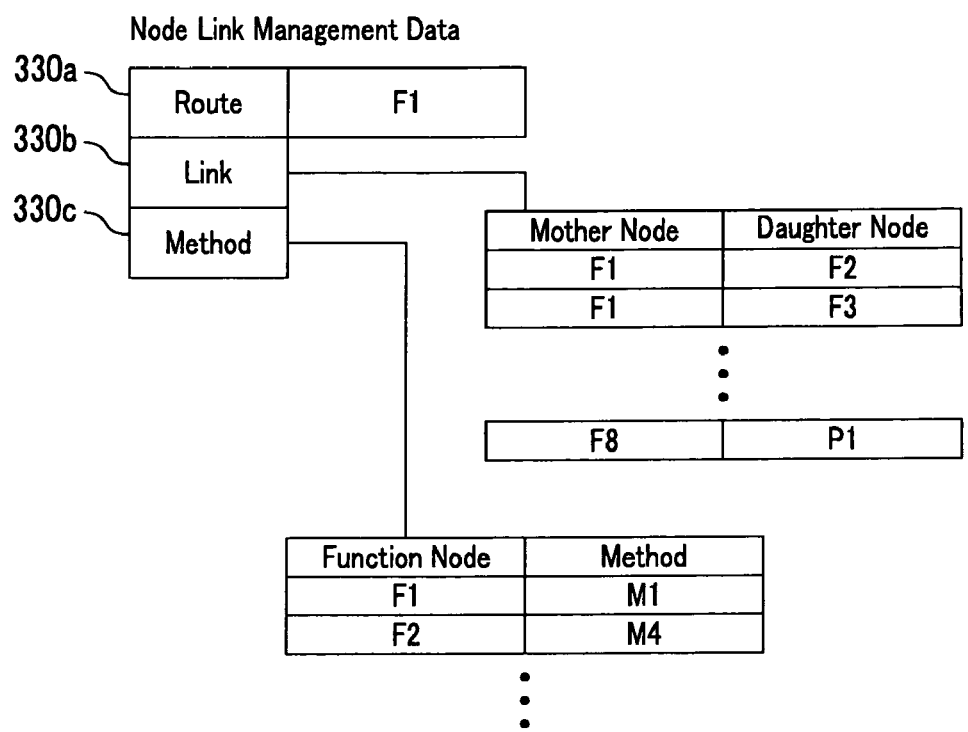
FIG. 5 is a schematic that shows an example of data structure of the node link management data which the node link management DB 330 manages.

FIG. 5 shows an example of the data construction of the node link management data that node link manager DB 330 handles. The node link management data prescribes the mutual relation among each of the nodes that compose the functional models. The relation of each of the nodes is presented in a hierarchical layer structure for example. The node link management data prescribe each of the nodes that compose the functional models. The relation of each of the nodes can be presented in a hierarchical layer structure. In the following discussion, a hierarchical layer structure is to be explained for easily understanding. Another relationship, other than the hierarchical layer structure is adopted since any simple relation between the nodes is accepted.

As shown in FIG. 5, the node link management data are managed by a route function node 330a, a link 330b and a method 330c in one record.

The route function node 330a presents the function node which is the major target of the equipment that is the design objective. The link 330b shows the mother-daughter relation. The method 330c shows that related to the function node as explained later.

The node link management data are generated in corresponding to the equipment which is the design objective. The operator can execute the generation and edition of the node link management data by using the data editor 110.

FIG. 6 shows an example of the data structure of the validation record data which the validation record DB 340. The validation record data are those to record the validation contents when a certain function node is reviewed. As shown in FIG. 6, the validation record data is given with a validation record ID 340a, an objective function ID 340b, a validation date and time 340c, validation term 340d, validation method 340e, validation conditions 340f and validation result 340g.

When the operator validates a certain function node, he can execute the generation and the edition of the node link management data by using the data editor 110. By this review, the validation records according to the function node are accumulated in the design support system 10.

Figure 7:
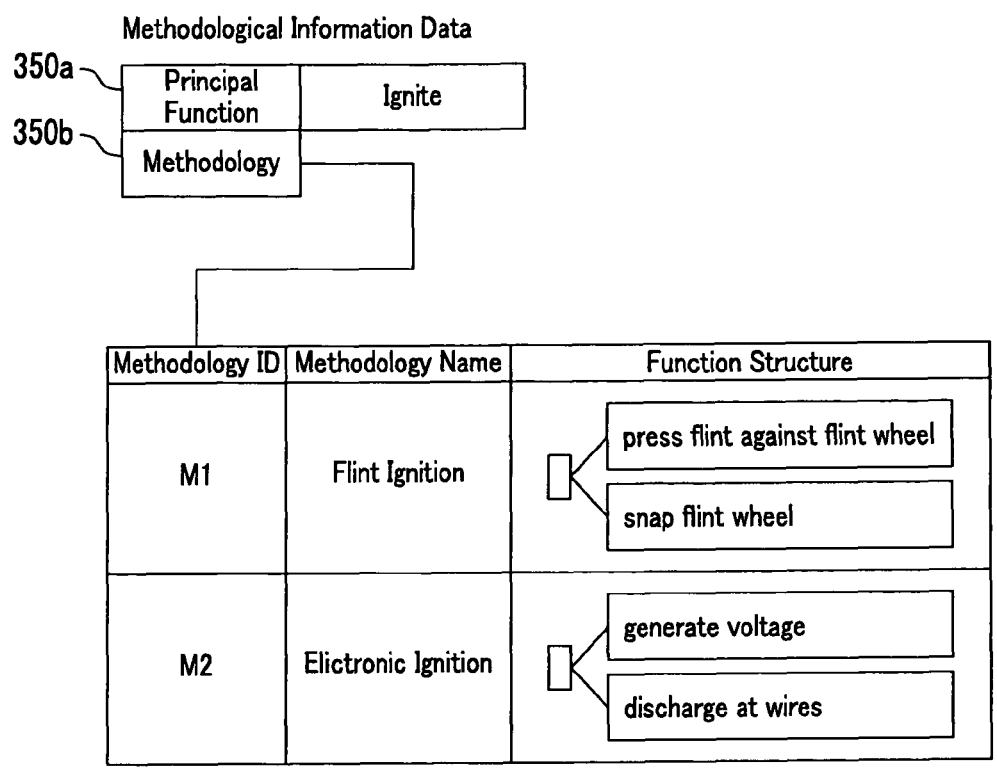
FIG. 7 is a schematic that shows an example of data structure of the methodology information data which the methodology information DB 350 manages.

FIG. 7 is an example that shows the data structure of the methodological information data that the methodological information DB 350 manages. The methodological data classify the functions into plural groups of the functions which are the cascaded down to the lower hierarchical layers from a certain top function. For example, the top hierarchical function as "lightening" is cascaded down to the first function group as "pushing the flint to the flint wheel" and "snapping the flint roller" and to the second function group as "generating voltage" and "discharging at the tip of the wire". The first function is summarized into "friction lightening" and the second function into "electronic lightening". By the selection of the function in the top level hierarchical layer, the functions which are cascaded down from the top are particularly determined.

As shown in FIG. 7, the methodological information data are managed as a principal function 350a and a methodological function 350b in a record. The principal function 350a includes the cascaded information such as a methodology ID, a methodology name and a function structure recorded as methodological information data.

The methodology information data are generated in correspondence to the equipment which is the design objective. The operator can effectively execute the generation and the edition of the functional models by using the methodology data as a design template. The operator can generate and edit the methodology data by using the data editor 110.

Figure 8:
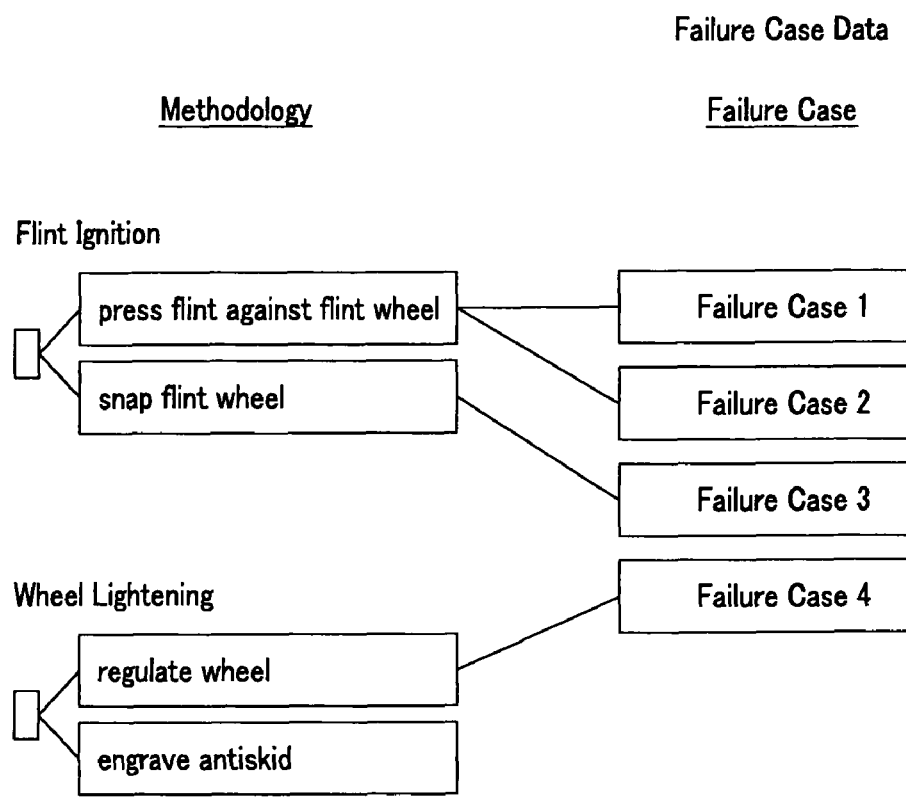
FIG. 8 is a schematic that shows an example of data structure of the methodology information data which the failure case 360 manages.

FIG. 8 is an example that shows the data structure of the methodology data that the failure case DB 360 manages. As shown in FIG. 8, the failure case DB 360 keeps records of the failure cases in correspondence to the functions classified in the function structure of the methodological information data. Therefore the failure cases are used as empirical failure issues or example of failures.

When the operator obtains a failure case regarding a function of certain methodological information data, he can record the failure case by using the data editor 110. By this recoding, the failure cases are stored in the design support system 10 in corresponding to the functionality.

The process history DB 370 is to record the history of various processes carried by the design support system 10.

The functional model generator 120 generates the functional models by referring to the function node DB 310, the part node 320 and the node link management DB 330 and can present the functional models on the display unit 210.

Figure 9:
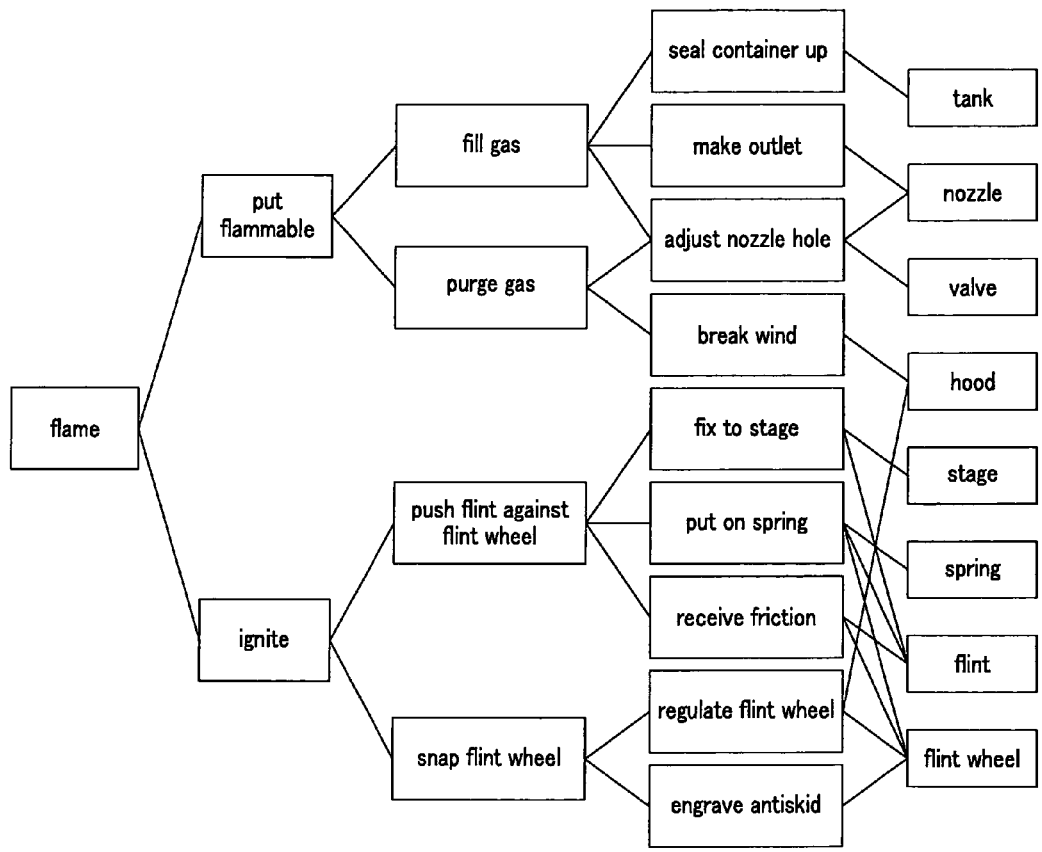
FIG. 9 is a schematic that shows an example of graphic presentation of the functional models displayed on the display unit 210.

FIG. 9 is an example of the presentation of the functional models displayed on the display unit 210. The functional model generator 120 determines the function node that may be a route to the lower hierarchical layer by referring to the route function node 330a of the node link management DB 330. In accordance to the link 330b, data are selected from the function node DB 310 and the part node DB 320. The functional models are generated by making a linkage to connect each of the nodes.

For the present example, the target function as "lightening" is selected from the function node which initiates the route to the lower hierarchical layer and then the functional nodes are cascaded down to the four lower hierarchical layers. The link has been terminated at the lowest layer which is ultimately parts as a "fuel tank", a "nozzle", etc. On the graphic presentation of the functional models, the icons of "detail presentation", "whole layer presentation", "upper one-hierarchical layer presentation", "lower one-hierarchical layer presentation", "comment input column", "validation item presentation", "methodology presentation", "failure case registration", "failure case retrieval" and "graphical presentation of parts" are given.

The designer operates the input unit 220 and clicks his desired icon while he is selecting either one of the nodes. The retriever 130 and other functional operation execute the following processes in response to the selected icons. For selecting the desired mode, the designer shifts the pointer to the mode and clicks.

When the "detail presentation" icon is clicked with selecting a certain functional node, the retriever 130 retrieves a corresponding function node from the function node DB 310 and the validation record data and presents the validation record data as detailed function information graphic on the display unit 210.

FIG. 10 shows an example of the detailed function information graphic presentation when the "detail presentation" icon is clicked under the selection of "purge gas" as for the function node. As shown in FIG. 10, the information is presented in the presentation unit based on the function node data retrieved by "purge gas" (function ID: F1) as a key and validation record data.

When "whole layer presentation" icon is clicked under selecting a certain node, the retriever 130 retrieves the node which is directly or indirectly linked to the selected node in referring to the node link management DB 330 and presents the functional model which emphasizes the selected node.

When the designer who is a user of the present design support system consider the changing the design of the equipment which is the design objective, it is important for him to understand the depth of influence caused by the change of parts and/or functions. The present design support system allows him to select the node of the part or the function either of which is the objective to be changed in the design on the display presentation of the functional model and understands the over all of the functions and parts that are influenced due to such change of the design by a simple click of "whole layer presentation" icon.

Figure 11:
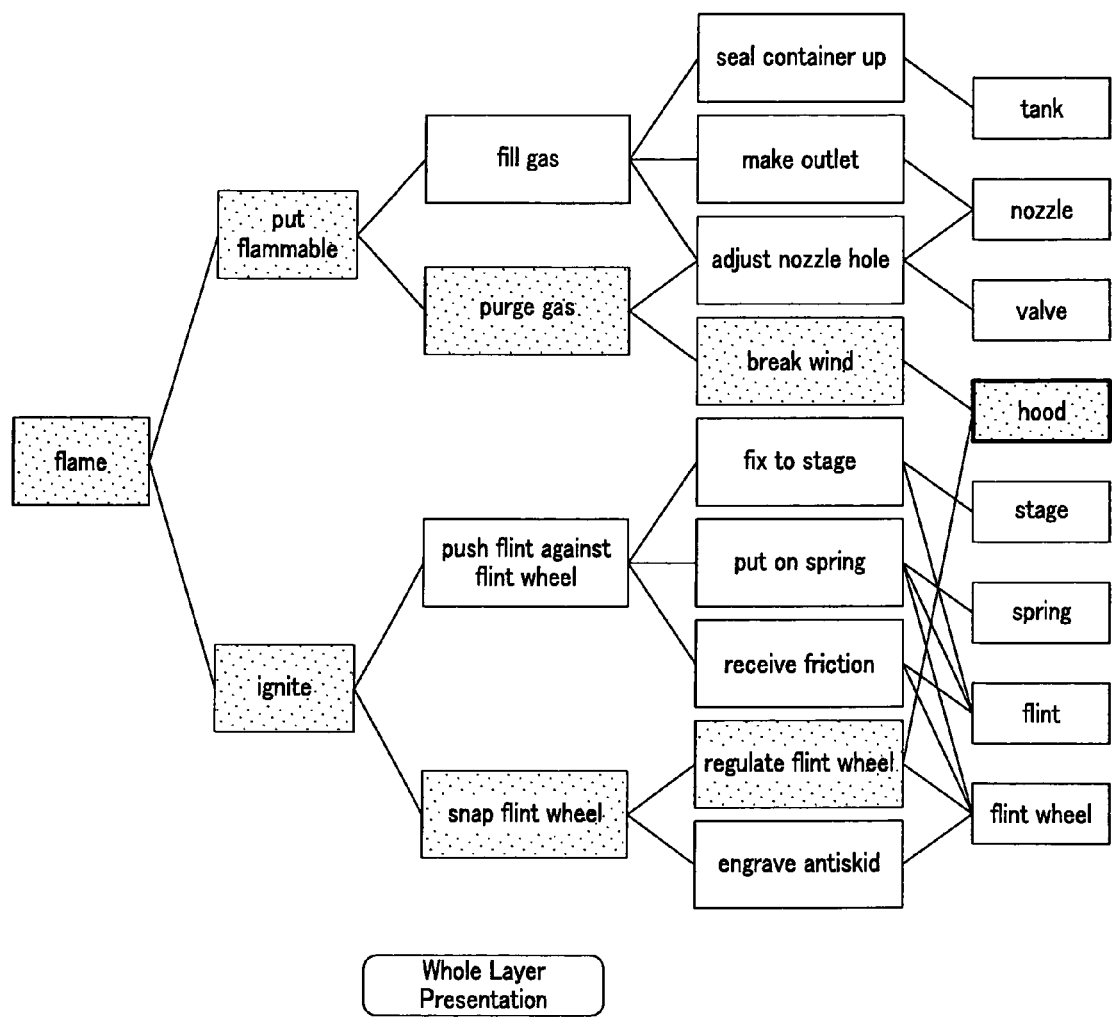
FIG. 11 is a schematic that shows an example of presentation of functional models in the case that the "whole layer presentation" icon is clicked under the selection of the "hood".

FIG. 11 is an example of presentation of functional models in the case that the "whole layer presentation" icon is clicked under the selection of the "hood" which is a part node. It should be noted that "purge gas", "snap flint wheel", "put flammable", "lighten" and "flame" which are the function nodes linked to the upper hierarchical layers in addition to the "break window" and "regulate flint wheel" which are directly linked to "hood" are emphasized. This cascaded link shows that the function node is influenced when the design of "hood" is changed.

When the selected node is the part node as shown in FIG. 11, the link uni-directionally extends to the upper hierarchical layer. However, when the function node is selected, the nodes lined in both the upper and the lower hierarchical layers are bi-directionally selected. By selecting the search to the lower hierarchical layer, it is possible to specify and check the all parts which are influenced by the change of the function of a certain function node. For retrieving the lower hierarchical layer, the retriever 130 can retrieve the nodes linked to the present node by referring to the node link management DB 330.

When "whole layer presentation" icon is clicked, all of the nodes which are directly or indirectly linked are presented.

After then, the retriever 130 can trace up the linkage to upper layer and lower layer by clicking "upper one-hierarchical layer presentation" and "lower one-hierarchical layer presentation", respectively, The traced links by such layer shift are emphasized in the graphic presentation.

Therefore, it is possible to remove the nodes from the objective to be considered if the designer thinks the nodes are unnecessary for reviewing the influence caused by the change of designs. It is further possible to effectively improve the design change operation by selecting the function nodes up to the hierarchical layers which are required for such reviewing.

It is possible to input the comments of the designer if he gives up displaying the hierarchical presentation before design completion. The controller 100 records the input comments in the comment column in the process history DB 370 with the graphics presentation of the hierarchical layers. Therefore, the designers can referrer to the reasons why he gave up the design before completion.

The retriever 130 can present the list format of the nodes selected in the "whole layer presentation" or "hierarchical layer presentation". It is also possible to select the validation items 310e included in the selected function node data.

The graphic presentation of the functional model includes "validation item presentation" icon. FIG. 12 shows an example of the graphic presentation when "validation item presentation" icon is clicked. FIG. 12A shows an example of the graphic presentation of the validation item presentation when "whole layer presentation" is clicked. FIG. 12B shows an example of the graphic presentation of the validation item presentation when the hierarchical layer presentation is given up before completion of presentation.

Figure 13:
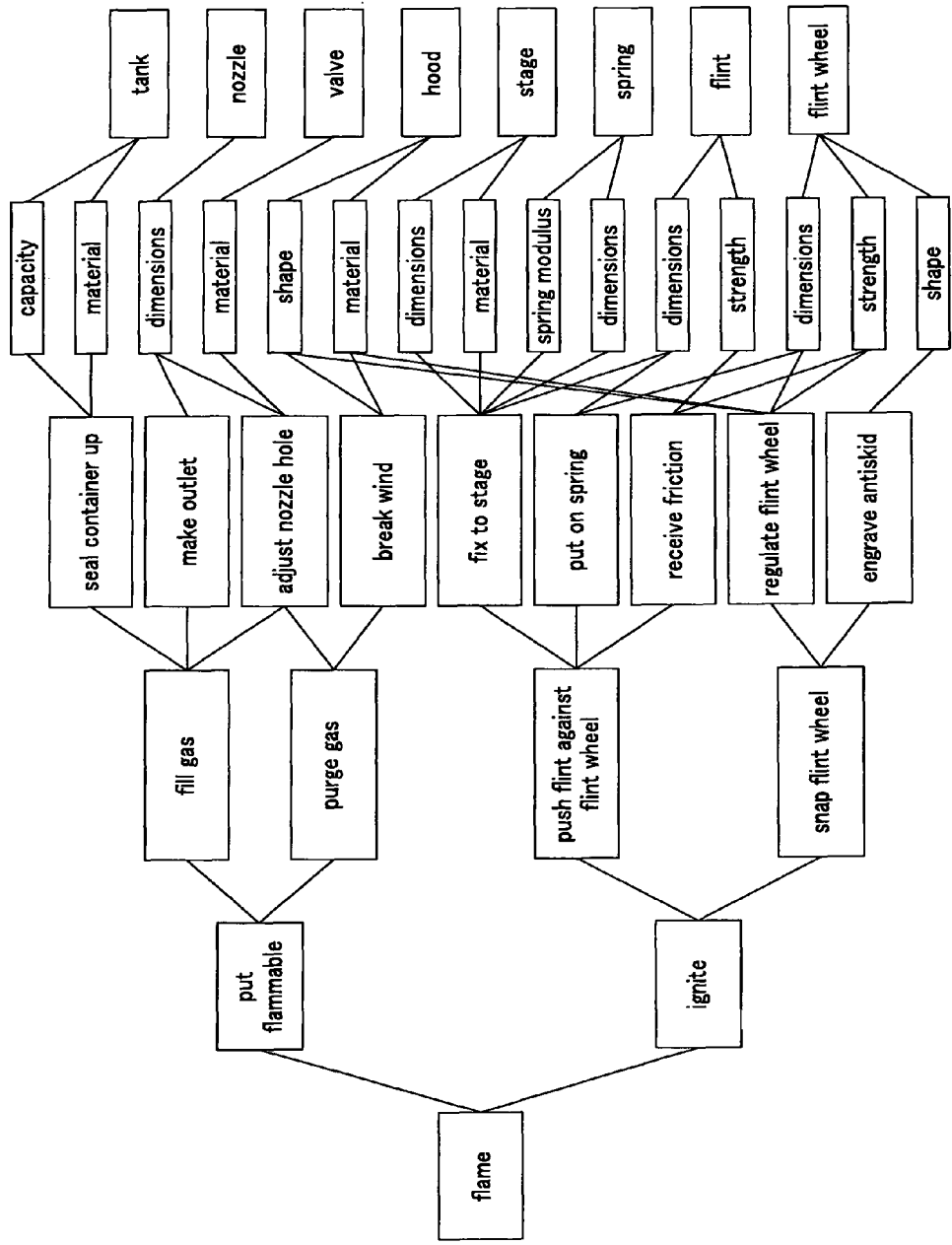
FIG. 13 is a schematic that shows the graphic presentation of the functional models when the linkages between the function nodes and the design parameters of the part nodes is made.
Figure 14:
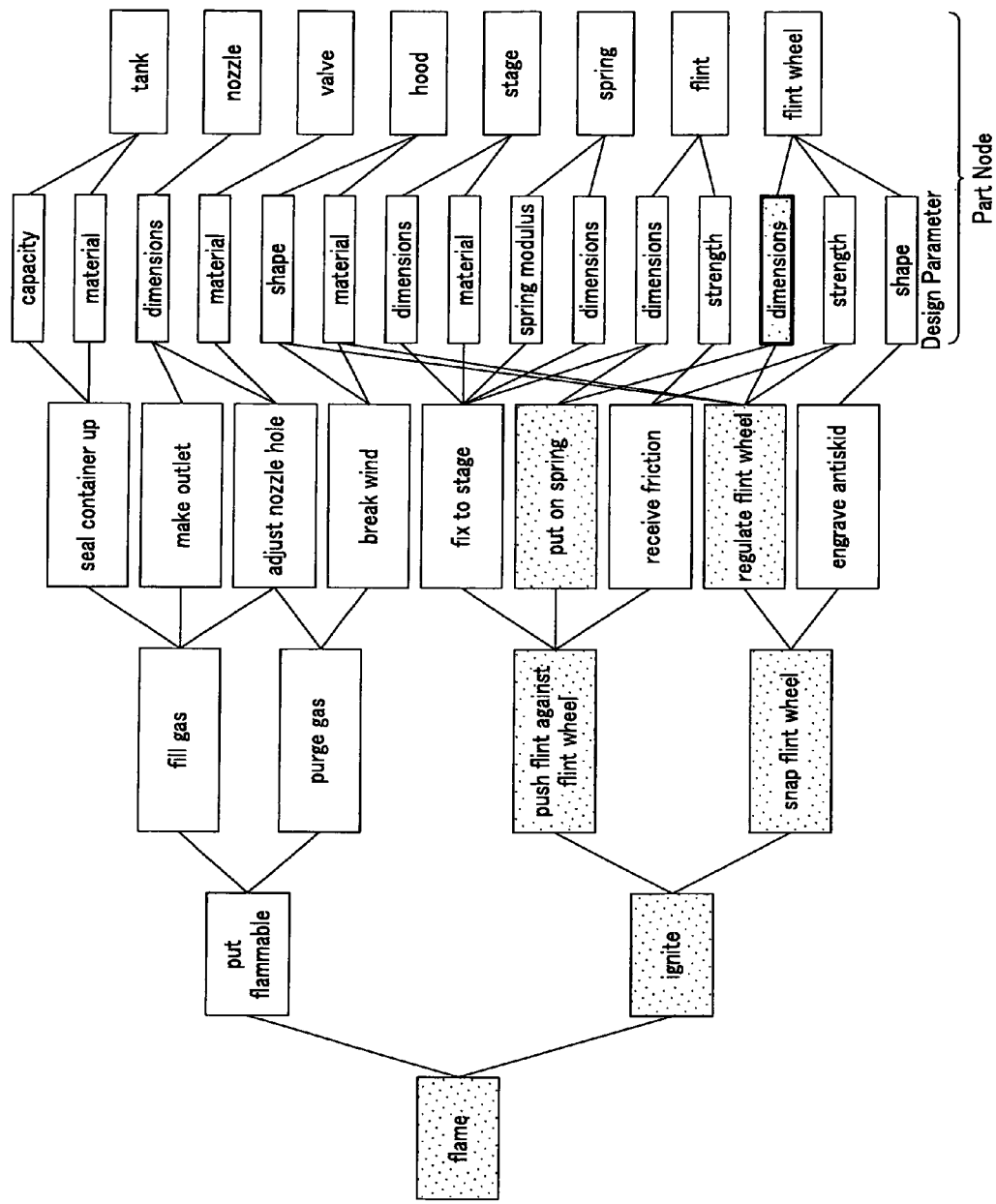
FIG. 14 is a schematic that shows the graphic presentation of the functional models when the linkages between the function nodes and the design parameters of the part nodes is made.

The node link management data directly make linkages between the function nodes and the part nodes. However, the linkages between the function nodes and the design parameters may be further preferred. FIG. 13 shows the graphic presentation of the functional models when the linkages between the function nodes and the design parameters of the part nodes.

For the example of FIG. 13, "flint wheel" which is a part node has links to "physical dimension", "strength" and "physical shape". The "physical dimension" in the design parameter is linked to "put on spring" and "regulate wheel".

In these functional models, it is preferred to click "whole layer presentation" with selecting "physical dimension" of the design parameter when the design of the physical dimension of the flint wheel is changed. Then the function nodes such as "put on s ring" an "regulate flint wheel" are emphasized. It is possible to confirm the range to which the influence of the change of the physical dimensions is effective.

When the function nodes and the part node are directly linked, the function nodes such as "friction generated", "anti-skid engraved", etc. which are not influenced by the change of the physical dimensions are selected and therefore the design operation can be effectively improved in the review for the design changing.

The data editor 110 displays the graphic presentation for the data input in the failure case and urges the operator to input the specific failure case when "failure case registration" icon is clicked on the graphic presentation of the functional models with selecting function nodes. The data editor 110 can record the input failure case in the failure case DB 360 linked with the selected function node.

The retriever 130 refers to the failure case DB 360 when the operator clicks "failure case retrieval" with selecting a certain function node. Then, the retriever 130 displays the failure case linked with the selected function node on the display 210 unit. In this operation, the operator can refer to the past failure cases regarding the function nodes.

It is preferred to display the failure case which is related to the linked function node. By this operation, it is possible to review over the relevant past failure cases.

It is possible to access the linked function nodes and all other function nodes which are in the lower hierarchical layers. By this operation, it is possible to isolate all of the failure cases relevant to the selected functions.

The present design support system 10 can store the functional models generated at a certain time in the process history DB 370. For example, when the design change is carried out for certain equipment A, the functional models which represent the equipment A are recorded. The functional models of the equipment B which is the equipment after the design change are recorded and then it is possible to simultaneously display the functional models of the equipment A and those of the equipment B on the display unit 210. This facilitates to visually confirm the changing portions in the function nodes and the part nodes. For such purpose, it is possible to detect the differences between two models and present the differences as the design changing portions.

When the operator clicks "graphic presentation of parts" in the graphic presentation of the functional models, the retriever 130 generates the graphic data of the equipment which is composed by the parts retrieved from the part node DB 320 in reference to the CAD information 320d and display the graphic data on the display unit 210.

Figure 15:
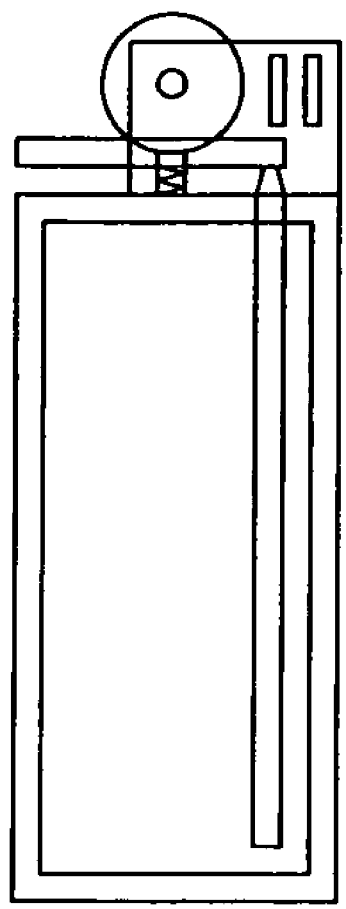
FIG. 15 is a schematic that the graphic presentation shows a lighter as an objective to be designed.

FIG. 15 shows an example of the graphic presentation of the equipment which is the design objective. The equipment is a lighter for this particular example. The graphic presentation is generated on the basis of CAD information 320d stored in the part node DB 320.

When the retriever 130 receives the selection of the parts on the graphic presentation, the retriever 130 selects the function node which is linked to the selected part with referring to the node link management DB 330 and displays the function node on the graphic presentation. FIG. 16 shows an example of the graphic presentation when the flint wheel is selected as a part. By using this graphic presentation, it is possible to visually confirm the part in the equipment and the influence against the function of the equipment due to the design change of the part can be confirmed.

When the operator clicks "graphic presentation of parts" with selecting the function nodes on the graphic presentation of the functional model, the retriever 130 selects the hierarchical layers that are lower than the layers of the selected function node in referring to the node link management DB 330. The retriever 130 further selects a group of the part nodes which are relevant to the group of the selected function nodes and display the CAD information 320d of each of the parts obtained from the part node DB 320 on the graphic presentation. By this operation, it is possible to confirm on the graphic display the necessary parts which realize the selected function.

Function validation models, which assist the design support associated with functional models, are explained. As discussed above, the functional models support the confirmation of the influential range when the design change regarding the function nodes or the part nodes have been carried out. It is possible to effectively perform the validation of the functions when the design change is carried out.

The function validation model makes the relation among target specification items (target parameters) of function nodes, operation condition items (operation parameters) and design parameters of the part node. In other words, the function validation model supports to validate certain value of "flow rate" which is a target parameter under particular conditions of "out door temperature" and "wind speed" which are the operation parameter when a function, for example, "purge gas" is the objective to be validated. Therefore, it can be said that the function validation model is a parameter-focused function model.

Figure 17:
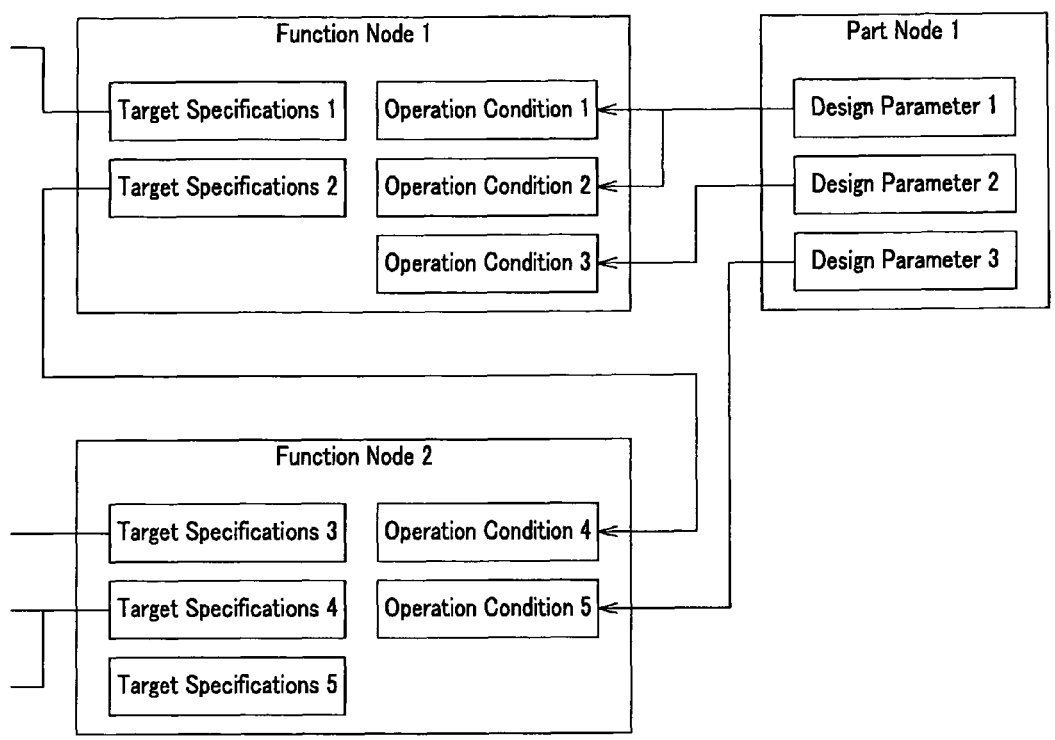
FIG. 17 is a schematic that explains the function validation model.

As shown in FIG. 17, the design parameter of the part node is related with the target parameter of the function node and the operation parameter of the function node is related with the target parameter of other function node.

In order to facilitate to make such relations, as shown in FIG. 18, the data editor 110 presents a list of the operation parameters regarding the function node data recorded in the function node DB 310 and the part node data recorded in the part DB 320 when certain design parameters or target parameters are noted. The data editor 110 displays a graphic presentation on the display unit 210 on which the operation parameters which make relations with the noted parameters. The designation to the operation parameters is, for example as shown in FIG. 17, carried out by marking the specific operation parameters (operation conditions) by which relations are made. The relation to the parameters are not uni-directionally but bi-directionally carried out so that the related parameters are mutually linked. The information to make the relation between the parameters is, for example, recorded in a data base constructed in the storage device 300 as a parameter link management DB. The technical word "parameter link management DB" is called a parameter relation information storage means in the claim 9.

The parameter link management DB can manage the information to be used for relating the parameters, for example, by paring the parameters which are mutually linked.

As the results of the present relation paring, the function validation mode is generated other than the function models. The each node of the function model and the each node (function validation node) of the function validation model corresponds to one-to-one relation however the link information to make links among the nodes. In other words, the functional models are linked in a unit of node and the function validation models are linked in a unit of parameters which are included in the nodes.

Figure 20:
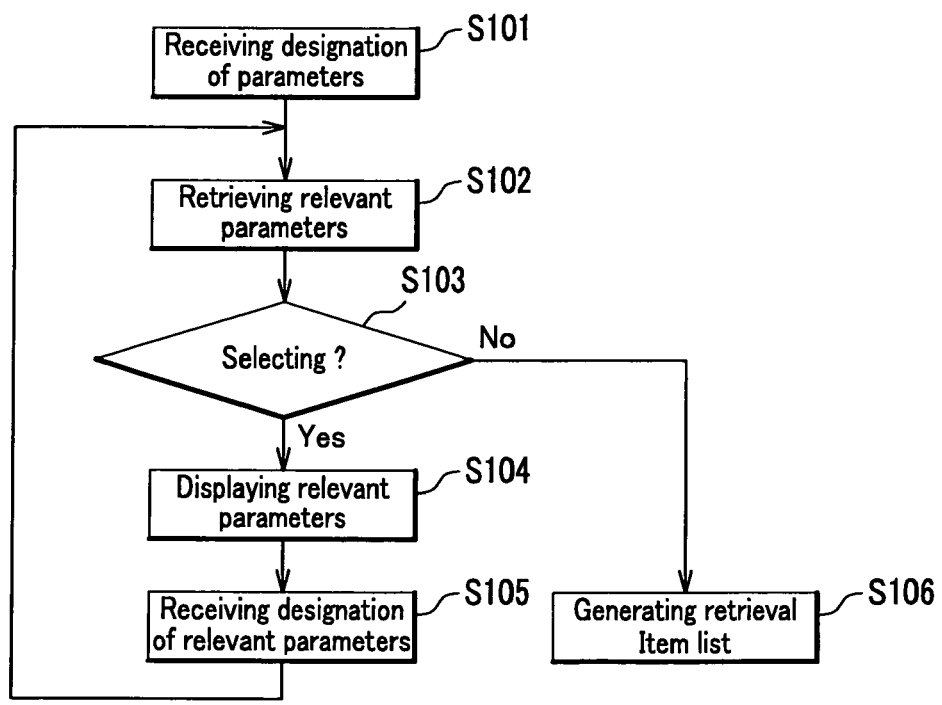
FIG. 20 is a flow chart that explains the function validation process using the function validation models.
Figure 21:
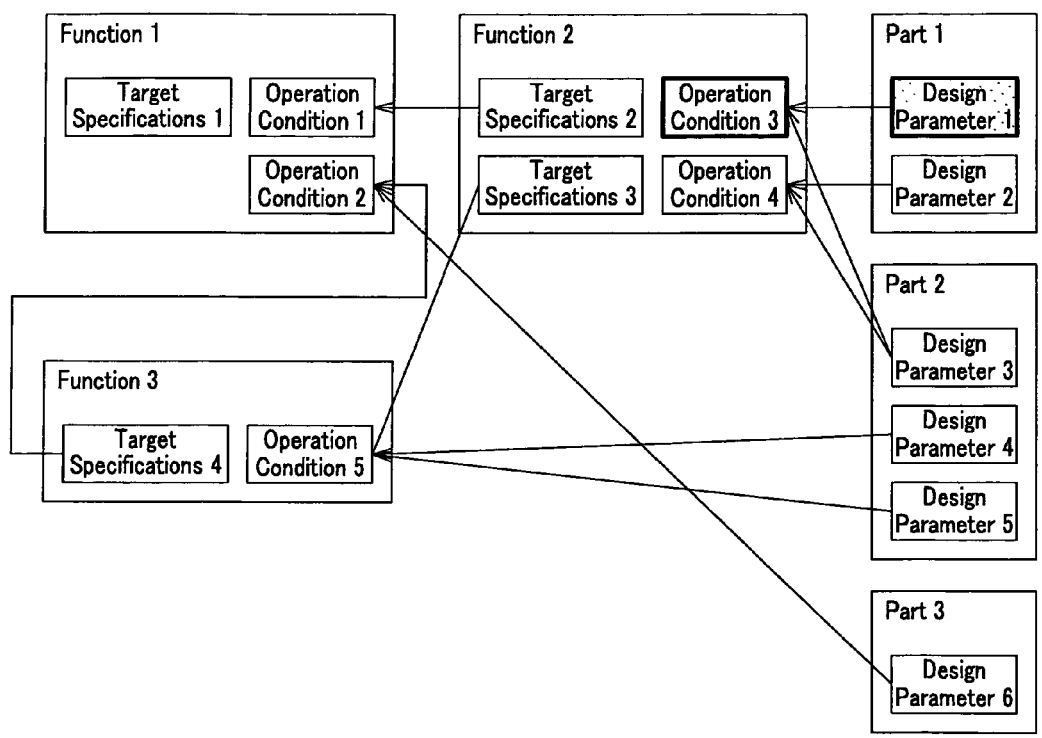
FIG. 21 is a schematic that explains the function validation process using the function validation models.

The function validation process using the function validation models are explained by using a flow chart in FIG. 20 and FIG. 21.

The design support system 10 receives the designation of the parameters which are objectives for the design changing by the request of the operator (S101). For the example shown in FIG. 21, the design parameter 1 of the part 1 has been directed. The design parameter 1 is, for example, the physical dimension of the part 1. The function validation node to be influenced and other parameters are selected when the physical dimensions are changed.

The retriever 130 retrieves the parameters which are related to the designated parameters and the function validation nodes that have the parameter based on the function validation models (S102).

As the result, when the parameters are selected (Y in S103), the selected parameter is displayed and the necessity for the validation to be influenced is noticed (S104). FIG. 21 shows, for example, the operation parameter 3 of the function 2 is displayed.

The selected function validation node and the parameters included in the function validation node are displayed and the design support system 10 receives the direction whether further validation is carried out (S105). In the example shown in FIG. 21, function 2 is presented as the selected function validation node and operation parameters 3, operation parameter 4, target parameter 2 and target parameter 3 are presented as parameters.

The direction whether further validation is carried out or not is determined by the operator who directs whether the change for the each of the selected parameters is carried out. In other words, the design support system 10 receives the direction of the operator regarding whether the further change will be carried out for each of operation parameter 3, operation parameter 4, target parameter 2 and target parameter 3. Of cause, the direction can be specified to the parameters which are to be changed or those which are not to be changed.

For this purpose, the design support system 10 displays a graphic presentation which has check boxes on the display device 210, by which the direction whether each parameter is to be changed or not is carried out as shown in FIG. 22.

The target parameter 3 and the operation parameter 3 are to be changed.

The retriever 130 retrieves the function validation nodes which have the designated parameters to be changed and the linked parameters (S102).

The parameters which are linked to the parameters which are directed not to be changed are excluded from the retrieval objectives. The example shown in FIG. 21 shows that operation parameter 5 of function 3 which is linked to the target parameter 3 that has been designed for no change and the setting parameter 3 of part 2 which is linked to the operation parameter 4 excluded from the retrieval objectives. However, these can be selected as those which are not to be modified.

As the result of the retrieving, the initial direction for the parameter design change is influential when new parameters or function evaluation nodes are not selected (N in S103). In other words, the retrieving is over as all of the function validation nodes which are to be validation effectives.

The design support system 10 generates a list of the selected function validation nodes and the selected parameters. The list can be presented on the graphic presentation. Both the parameters which have been the objectives to be changed and those which have been the objective not to be changed are distinctly presented. The validation items 310e recorded in the function node data is included. The parameters to be changed are influenced and it is possible to determine the items to be reviewed in overall range. The list, such as the validation item list for example, is stored in the storage unit 300.

The user who is in charge of designing hand a printed table of this list out to validation operators and he can bring the validation items resulted from the design change to the validation operators without any omission.

Figure 23:
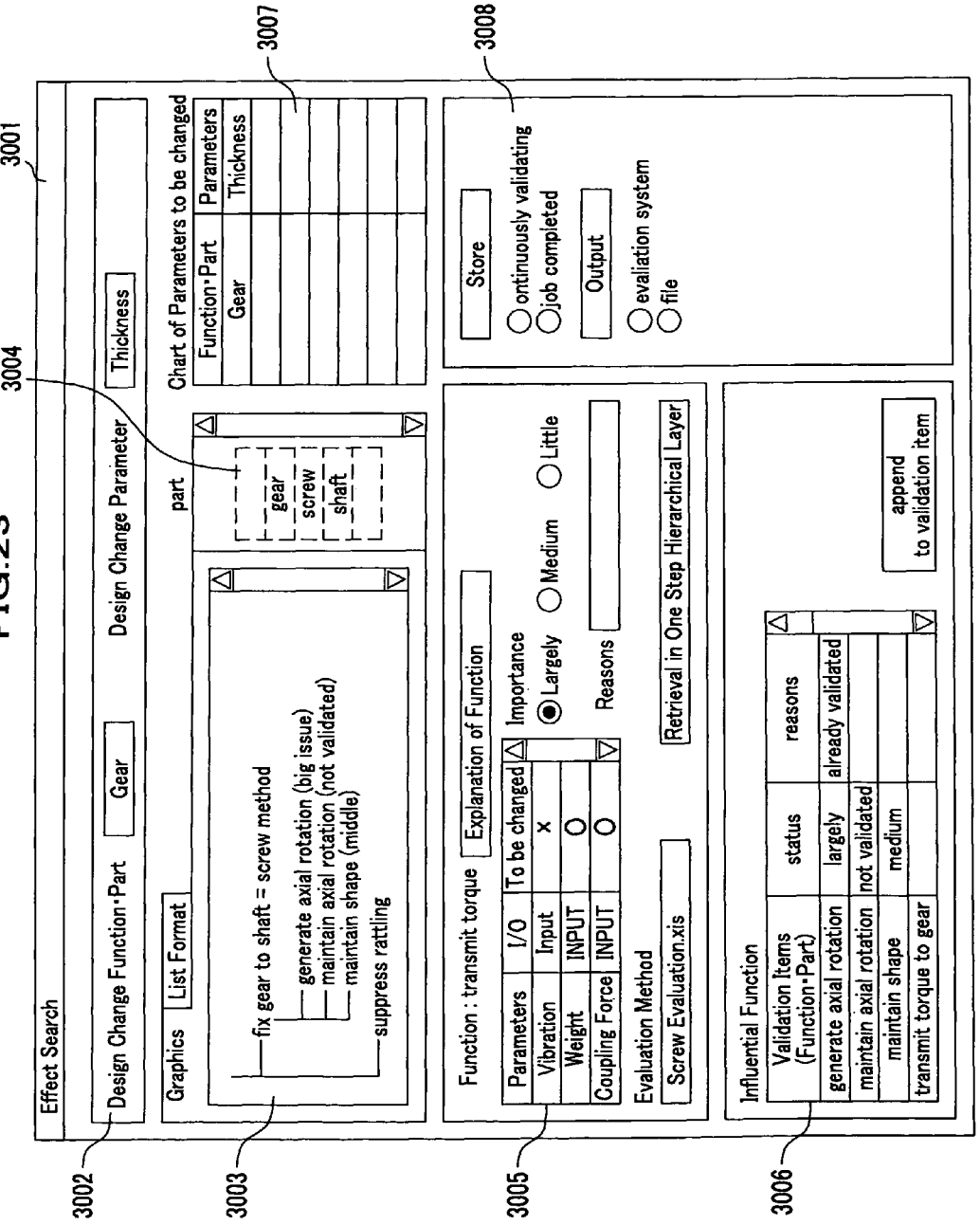
FIG. 23 is a schematic of another example that shows a graphic presentation to carry out functional validation process.

The function validation process using the function validation models can be carried out on the graphic presentation without the operator being conscious of the function validation models. FIG. 23 shows another example of the graphic presentation by which the function validation is processed.

By using the graphic presentation 3001, it is possible to study the influences caused by the design change. In the bar 3002, the initial parameters for the influence study are shown. The major purpose for the study is shown. The text area 3003 is to present the functional models and the validation item. In FIG. 23, the functional models are presented and the validation item list is presented in the graphic presentation 3101 as shown in FIG. 24. The validation item list one-to-one corresponds to the function validation models and the function data nodes. Both presentation as the function model and the validation item list can be selected by using the tub locating in the upper left.

The text area 3004 is a part list chart that shows the whole chart of the parts composing the equipment which is the design objective. The table 3005 shows the part which may be changed on the part list chart in the text area 3004, the validation items or the function data to be selected in the function models shown in the test area 3003 or the validation item list in the graphic presentation 3101.

The table 3005 shows the area where the contents of the function data and the function validation models. The function names, the explanations, the parameters for validation, and input/output selection, change/un-change assignment and the validation method can be set and displayed. The input parameters correspond to the operation parameters and the output parameters to the target parameters. The importance and the reasons for the validation for specific change can be set. In the area 3005, the selection of the "retrieval in one step hierarchical layer" for the direction of searching is input after the parameter change or the parameter unchanged.

The result obtained by the direction of the search by clicking "the retrieval in one step hierarchical layer" is presented in the chart 3006. In this chart, the retrieval result in the function validation models after one searching which is directed by "retrieval in one step hierarchical layer". The operator can click "append to validation item" by which he can direct to append the validation item to validation items already shown in the chart 3006 after confirming the validation results therein. The icon for appending the validation item works as a retrieval direction receiving means that receives the direction of the operator.

By clicking "append to validation item", the function validation models (validation items) are appended to the function models in the text area 3003 and the validation item list 3101.

Each validation model has a status record regarding whether the validation model has been validated and the change influence has been checked. This status information is shown in the text area 3003, the validation item list 3101 and the chart 3006. For all of the validated function validation models, the operator repeats to search the function selection in the text area 3003 and the validation item list 3101, the direction of changing parameters and influences until validating the influence of the changes.

At the time when all of the searches have been completed, it is possible to "store" the validation items by clicking "store" which is in the area 3008. The present status record in the search is implemented for the purpose to continue the discontinued operation afterwards.

An example of the validation list which is stored by using the "store" icon is shown in FIG. 25. The parts and the parameters which cause the design change are stored as the purpose of changing. The validation contents, changing parameter, unchanging parameters, importance of validation and reasons are stored.

It is possible to surely retrieve the influence of the function validation model network and the functional models without complicate graphic presentation even if they are in large scale.

Another embodiment of the present invention will be explained.

Figure 26:
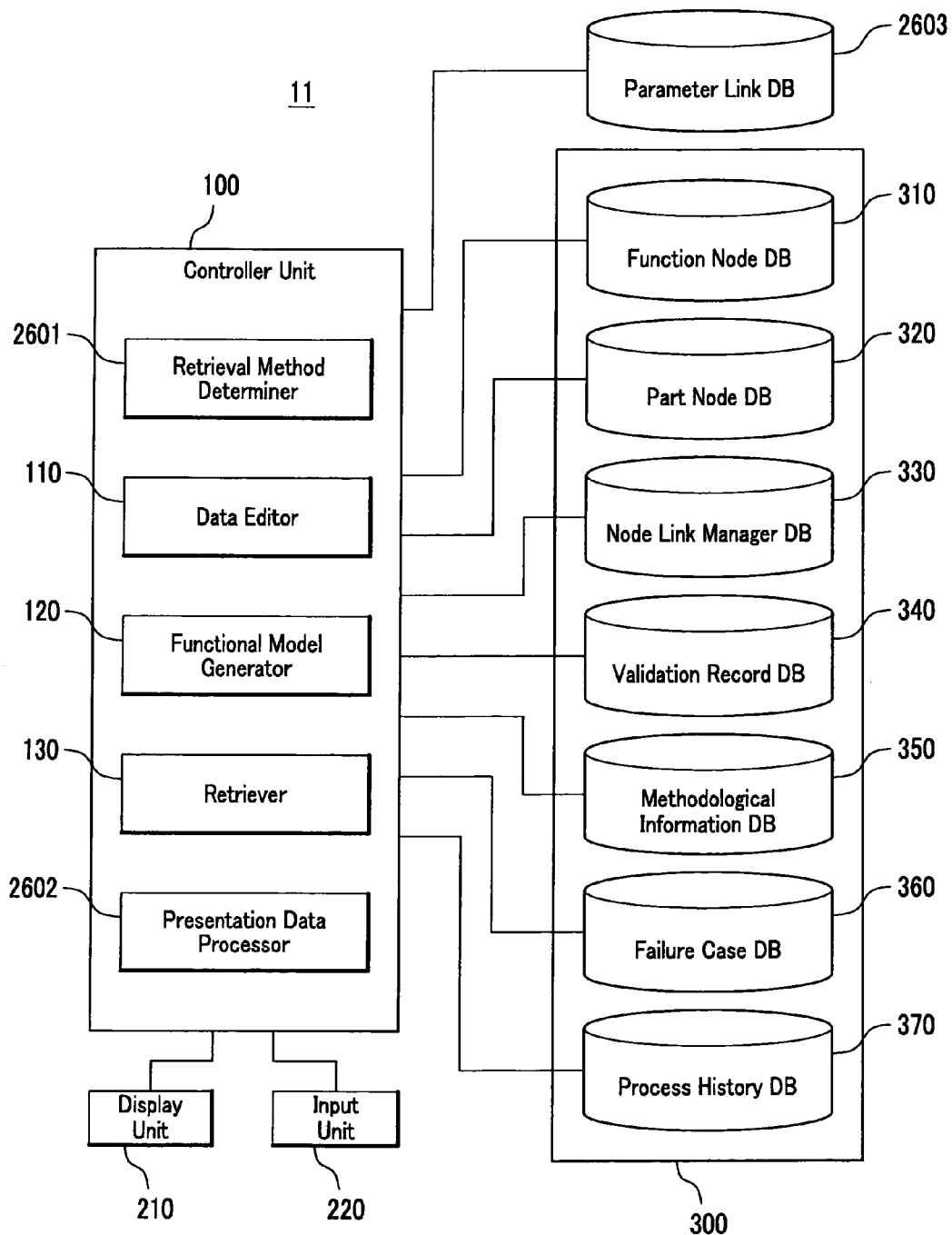
FIG. 26 is a block diagram of an embodiment of the design support system of the present invention.

FIG. 26 is an example of block diagram that shows the structure of the design support system 11 regarding the presentation embodiment. The embodiment includes functions such as validation method evaluator 2601 and presentation data processor 2602 and a parameter link DB 2603 in addition to the design support system 10. The functional models and the function validation models are constructed inside of the system. The parameter link DB 2603 defines paring of these models.

In the function validation models, the parameters attributing to the function nodes and the part nodes have flags for specific purposes. There are two types of flags as "performance parameters" and "direct change parameters".

The values of "Performance Parameter" represent the values which are the apparent specifications (performances) of the products. For example, "append to validation item" is a part of the product specifications. The values of "direct change parameters" are concrete ones related to the parts which compose the products. The lighter as an example, the dimension of the fuel tank, the friction coefficients of "flint" and "flint wheel" and spring modulus.

In the design operation, the designer scarcely changes the "performance parameters". The designer directly changes "direct change parameters" and he changes in a variety to fulfill the predetermine specifications.

Figure 27:
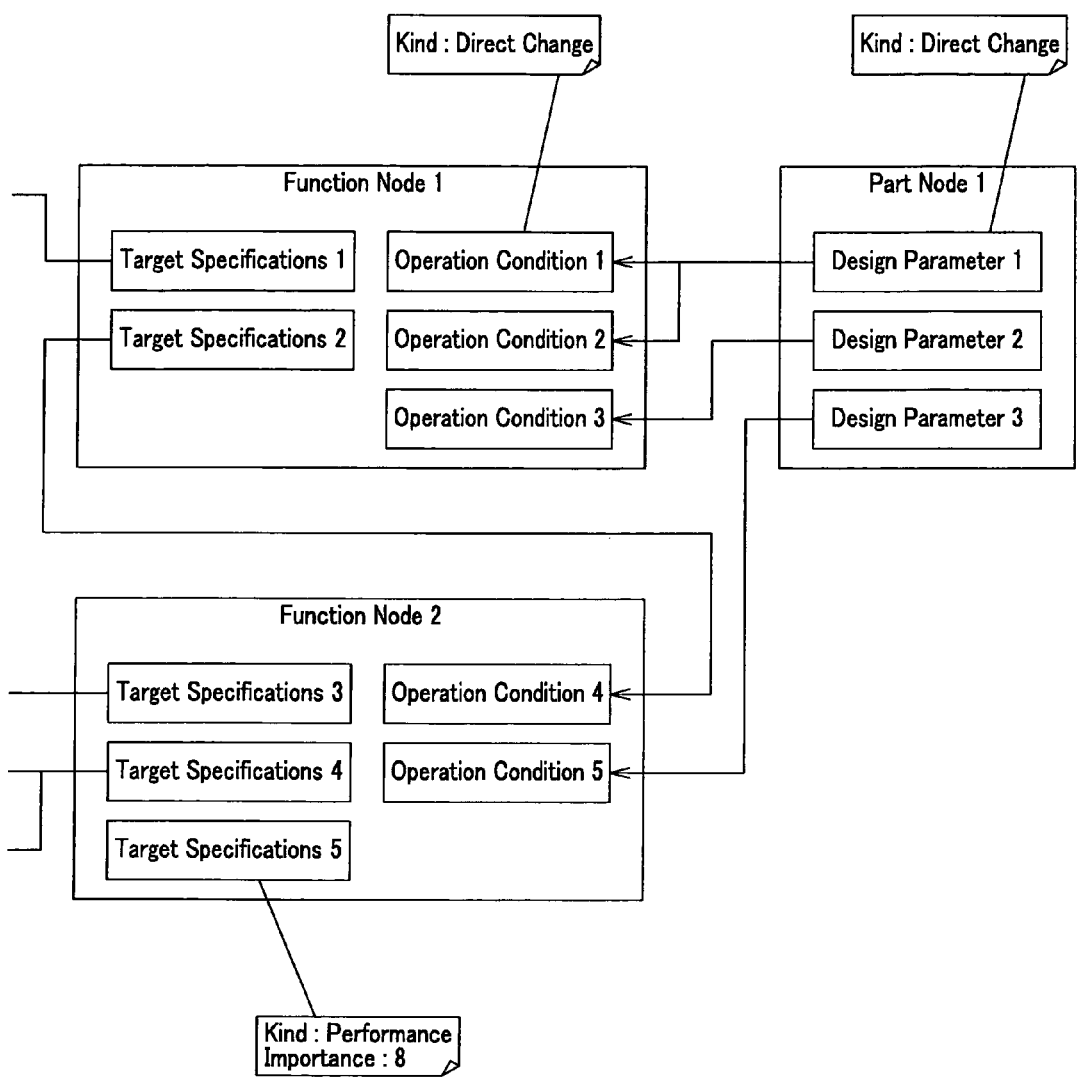
FIG. 27 is a schematic that explains the flags to be implemented in design parameters.

It is designed to classify the importance in the "Performance Parameters". There are varieties of importance in the specifications for the users. For example, the success of lightening is more valuable than the continuous service time. Depending upon the preference of the users or usages of the equipment, the importance can be such value presented in quantity. FIG. 27 shows an example of the parameters that are implemented with the importance and the flags.

Figure 28:
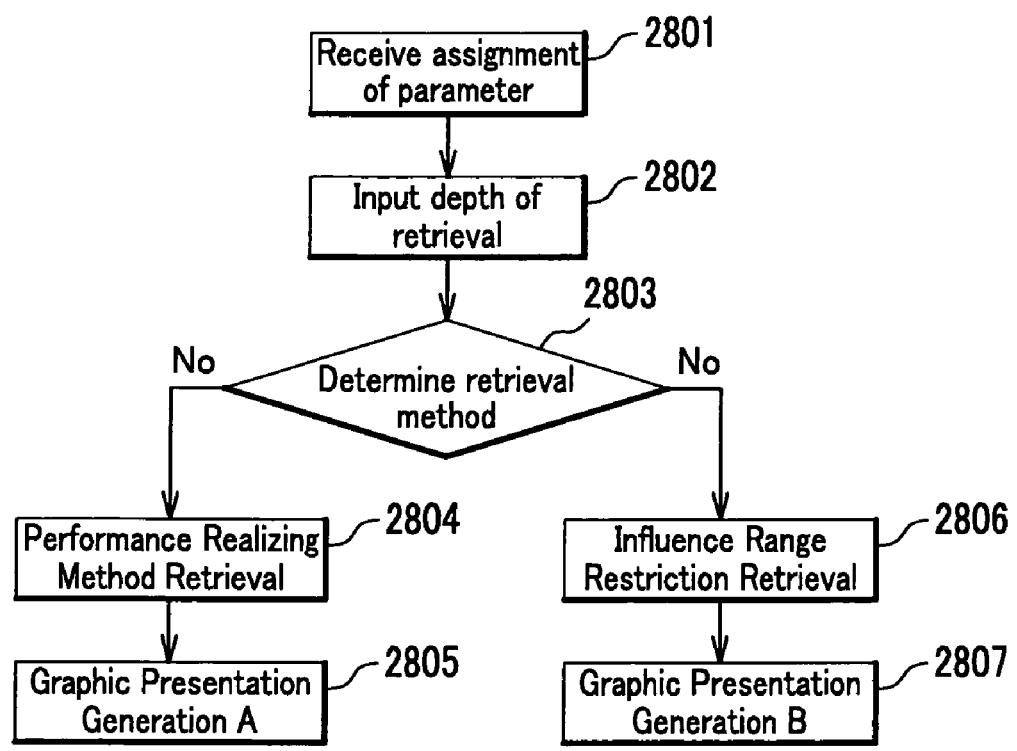
FIG. 28 is a flow chart that shows a retrieval process installed in the design suspension system of the present invention.

It is possible to set the flags and the importance by changing the function model generator 120. The retrieval process in the design suspension system 11 is explained in details using the flow shown in FIG. 28. The start of the retrieval is always from the flagged parameter.

The designer input the design change as the change of parameter (Step 2801). The designer input the depth Ds of retrieval (Step 2801) in order to specify more direct causality relevant for the required design changing (Step 2802). This step is arbitrary so that it is not necessary to set the depth of retrieval if it is not necessary to specify more direct causality.

The retrieval method determiner 2601 determines the validation process method by checking the flag which is attached to the parameters (Step 2803).

If the kind of parameters is "performance parameters", the step goes to the step 2804. If it is "direct changing parameters", the step goes to the step 2806.

Figure 29:
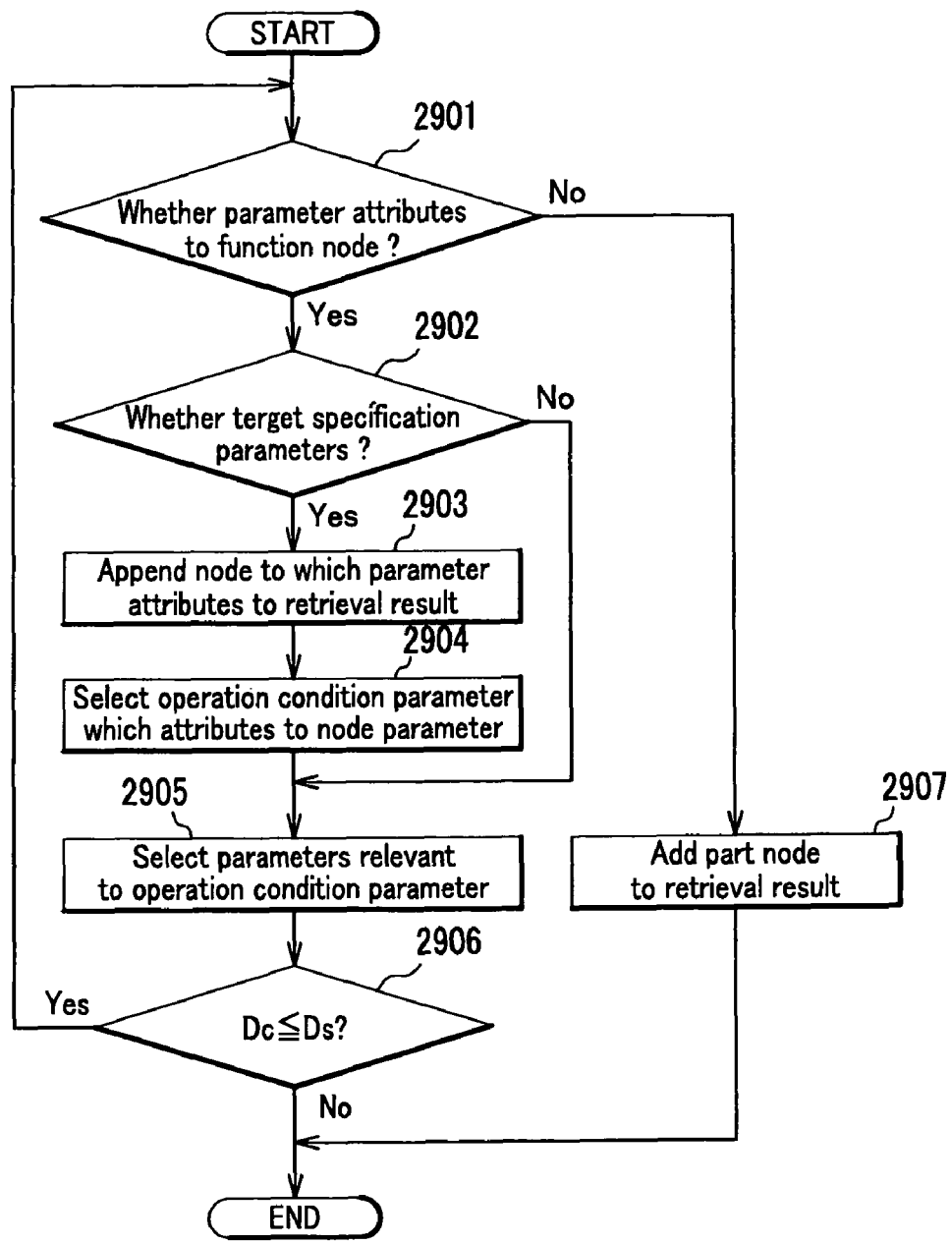
FIG. 29 is a flow chart that shows a performance realizing method retrieval process.

In the step 2804, a performance realizing method retrieval process is carried out. This retrieval process is to search the necessary function nodes to be reviewed in order to change the performance parameter. The process flow is shown in FIG. 29.

It is judged whether the parameter attributes to the function node (Step 2901). If the parameter attributes to the function node, the steps advance to Step 2902. If the parameter attributes to the part node, the steps advance to Step 2907. The distance counter Dc is set to be zero.

In the step 2902, it is judged whether the parameter is the target specification parameter or the parameter is the operation condition parameter. If the parameter is the target specification parameter, the node to which the parameter attributes is appended as the retrieval result (Step 2903) The operation condition parameter to which the parameter attributes is selected (Step 2904) and executes the operation in Step 2905. In the step 2902, the step advances to Step 2905 if the parameter is the operation condition parameter. In the step 506, the distance counter Dc and the retrieval depth Ds are compared. If Dc is less than or equal to Ds or Ds has not been set, each parameter is processed after the step goes back to Step 2901. If Dc is larger than Ds, then the process is ended.

In the step 2907, the part node is added to the retrieval result and the process is ended. The rule of the retrieval distance is that 1) the distance of the parameter is not accounted if the parameter is in the same node, 2) the linked parameter and the link stringed to the parameters are accounted as a unity and 3) the shortest route is adopted if there are plural routes between two parameters to be objective.

When the step 2804 is ended, the graphic presentation for the retrieval results is generated (Step 2805) at the presentation order determiner 2602.

The current system presents the retrieval results as the list of function nodes or part nodes. The order of the presentation is determined by the importance set in the function validation model.

The order of the presentation is carried out in such a manner that the importance is given to the parameter included in the node then the parameter is presented first. The more the importance, the earlier the parameter presented. If there are plural parameters are assigned to the node with the importance, the most important parameter is used for the judgment. If the importance is the same point, the second importance is used for the judgment. The nodes to which no importance has been labeled, the importance is judged by the distance from the most important parameters. If the order is in the same, then the order is not accounted or not cared. The distance is measured with the same idea that of the distance counter Dc retrieval process. If two distances from the most important nodes are the same, the distance from the second most important nodes are used.

For example, the parameter as "continuous service time" of the lighter is the "performance parameter" in FIG. 30. If the value of the parameter has been changed to "5 hours" from "2 hours" and the retrieval distance is set to be 2, then the output is shown in FIG. 31

By presenting like as in FIG. 31, it is possible to get to know the importance of the validation which may be influenced by the performance parameters.

It may be possible to specify the retrieval result within part node without setting the retrieval depth. In order to satisfy the change of "performances", the part which needs review is retrieved. The retrieval depth in Step 2802 is not required. Since may of the designers consider the product designs mainly based on the parts, this approach is compliant to the sense of the designer. The output is presented as shown in FIG. 32.

In the above discussion, the depth of retrieval is measured by the parameter link. However, the layer quantity of the hierarchical layers regarding the functional models is used. The distance between "put flammable" and "break window" is 2 for the case of FIG. 31.

In Step 2806, influence range restriction retrieval is carried out. This retrieval process is to retrieve to determine the specific node in order to minimize the influence due to the direct change of the parameters.

In the search of this process, the retrieve goes up to the hierarchical layer as set. The rule for the distance between the parameters is same as explained regarding Step 2804. In other words, the shortest route provides the distance with the rule that a link between parameters is unity.

Figure 33:
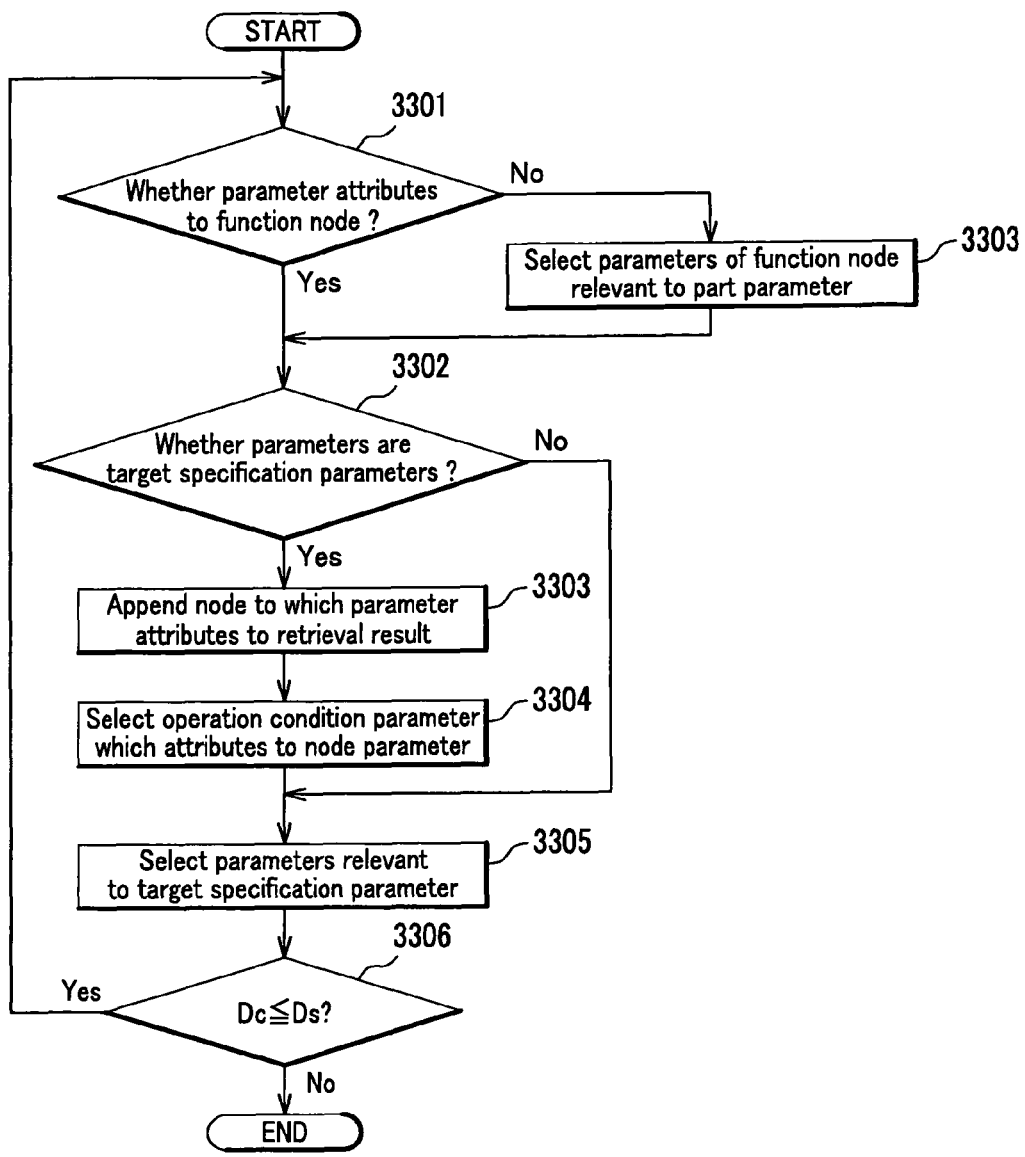
FIG. 33 is a flow chart that shows a process of influence range restriction retrieval.

More specifically, the process is carried out in the order as shown in FIG. 33.

The parameter is judged whether it attributes to the function nodes (Step 3301). If it attributes to the function nodes, the step proceeds to Step 3302 and if it attributes to the part nodes, the step proceeds to Step 3307. The distance counter Dc is set zero.

In Step 3307, the part node is added to the retrieval results, and the parameter of the function node which is relevant to the parameter is selected and the step proceeds to Step 3302.

In Step 3302, it is judged whether the parameters are target specification parameters or the operation condition parameters. If the parameters are the operation condition parameters, the parameters are added as intermediate retrieval results (Step 3303). By selecting the target specification parameters (Step 3304) which belong to the function nodes to which the parameter attribute, Step 3305 is executed for each of the parameters. In Step 3302, if the parameters are the target specification parameters, the step directly proceeds to Step 3305. In Step 3305, the parameters relevant to the operation conditions are selected and the distance counter Dc counts up with a unity. In step 806, the distance counter Dc and the depth of retrieval Ds are compared if the depth of retrieval Ds has been set. If Dc is less than or equal to Ds, each of the parameters is processed in Step 3301 after the step goes back to Step 3301. If Dc is larger than Ds, the process is ended. When Ds is not set, the depth of retrieval is set by a unity as a default value. This default value can be set before the process starts and can be a value other than unity.

Next, the retrieval results are obtained in the process shown in FIG. 29 using intermediate retrieval result parameter. When Step 2806 is ended, the graphic presentation of the retrieval result is generated in the presentation ordering determiner (Step 2807). The retrieve result is presented by the distance of the parameter of the initial retrieval node in the influence range restriction retrieval.

Taking the functional model and the function validation model of the lighter as shown in FIG. 30 as an example, we consider the case the physical shape of the part "hood" has been changed. The retrieval distance has been assigned to be 2. Then the output which is the result of the search is given as shown in FIG. 34.

In this retrieval process, the designer can complete the design change in a compact range to minimize the influence of the design change against the equipment.

It may be preferred to confine the retrieval results into the part node. Then the output is given as shown in FIG. 35. This shows the search of auto-reflection parts which is parts in the scope to which the influence of the design change reflects.

In the above retrieval method, the kinds of parameters such as "performance parameters" and "directly changed parameters" have been set beforehand. However, the kinds of the parameters can be set by using the hierarchical level in the hierarchical structure. For example, the parameters included in the first layer (the top layer) to the second layer in the hierarchical layer on the functional models are set as "performance parameters" and the parameters included in the forth layer to the lowest layer and the parameters included in the part nodes are set as "directly changed parameters". The hierarchical layer level used for setting "directly changed parameters" should be lower than the hierarchical layer level used for the "performance parameters". It may be preferred that the parameters only included in the part nodes are set as "directly changed parameters". As another definition, it may be possible that "directly changed parameters" are the parameters included in the part node and "performance parameters" are the rest. Since the designer can directly change the physical dimensions and materials in his design procedure or process, the above retrieval method is practical.

By using this method, it is possible to save the laborious work for setting the kinds of parameters beforehand.

In the above functional models and function validation models, the parts which compose the equipment are only assigned for the part nodes. However, it is possible to assign the fuels and energy to operate the equipment and the adhesives to be used at the time of assembling to the part nodes.

For example, it may be possible to use "gas" for a part node of lighters. The environment where the equipment is used may be a part node. For example, a part node as "outside environment" is generated and "temperature" and "humidity" are input as the values of "outside environment".

By these practical usages of the design support system, it is possible to generate the functional models and the function validation models which are assumed to be compliant to the actual use of the equipment and possible for the operator to design the equipment which has less failure.

What is claimed is:

1. A design support system, comprising:
    a node data storage means that stores node data, including a group of function nodes which include nodes representing functions performed by an apparatus to be designed, the functions being subdivided from upper functions to lower functions, wherein each of the function nodes includes one or plural operation parameters and target specification parameters, and a group of part nodes include part nodes representing parts for realizing the functions, wherein each of the part nodes includes one or plural design parameters;
    a functional model generating means that generates a functional model in which the upper functions, the lower functions, and the parts are associated with one another and are hierarchized with reference to the node data stored in the node data storage means;
    a node designation receiving means that receives the designation of a node among the functional models;
    a node selection means that:
        selects, if the designated node is one of the part nodes, at least one of the function nodes associated with the designated part node in an upper hierarchical level than the designated part node; and
        selects, if the designated node is one of the function nodes, at least one of the function nodes and the part nodes associated with the designated function node in an upper or lower hierarchical level than the designated function node;
    a display unit that displays the at least one node selected by the node selection means;
    a parameter relation information storage means which stores parameter relation information that defines a pairing of the parameters;
    a function validation model generation means that generates a function validation model that shows a relation among parameters included in the node by referring to the parameter relation information storage means;
    a parameter designation receiving means that receives the parameter designation from the function validation model;
    a parameter selection means that selects parameters related to the designated parameter; and
    a parameter display means that displays the parameters selected by the parameter selection means in an order of importance of a specification if the designated parameter relates to a change in an apparent specification.

2. The design support system according to claim 1, wherein:
    the function nodes include validation item data regarding the functions; and
    the display unit presents a list of included validation item data regarding the selected function nodes.

3. The design support system according to claim 1, wherein the node selecting means has a capability to select all nodes over hierarchical layers or select all nodes in each of the hierarchical layers.

4. The design support system according to claim 1, further comprising:
    a validation record data storage means that stores validation record data which makes a relation with the function nodes;
    a validation record data selection means that selects validation record data regarding a node to which a designation is given; and
    a validation record data display means that displays the validation record data.

5. The design support system according to claim 1, further comprising:
    a failure case data storage means that stores failure case data related to the function node;
    a failure case data selecting means that selects failure case data regarding a node to which a designation is given; and
    a failure case data display means that displays the failure case data.

6. The design support system according to claim 5, wherein said failure case data selecting means selects failure case data related to failure case data in a lower hierarchical layer than a node to which a designation is given.

7. The design support system according to claim 1, wherein the part node has one or plural design parameters and hierarchical layers of the part nodes and the function nodes are constructed with parameters to be used for design.

8. A design support system, comprising:
    a node data storage means that stores node data, including a group of function nodes which include nodes representing functions performed by an apparatus to be designed, the functions being subdivided from upper functions to lower functions, wherein each of the function nodes includes one or plural operation parameters and target specification parameters, and a group of part nodes which include part nodes representing parts for realizing the functions, wherein each of the part nodes includes one or plural design parameters;
    a functional model generating means that generates a functional model in which the upper functions, the lower functions, and the parts are associated with one another and are hierarchized with reference to the node data stored in the node data storage means;
    a node designation receiving means that receives the designation of a node among the functional models;
    a node selection means that:
        selects, if the designated node is one of the part nodes, at least one of the function nodes associated with the designated part node in an upper hierarchical level than the designated part node; and
        selects, if the designated node is one of the function nodes, at least one of the function nodes and the part nodes associated with the designated function node in an upper or lower hierarchical level than the designated function node;
    a display unit that displays the at least one node selected by the node selection means;
    a parameter relation information storage means which stores parameter relation information that defines a pairing of the parameters;
    a function validation model generation means that generates a function validation model that shows a relation among parameters included in the node by referring to the parameter relation information storage means;
    a parameter designation receiving means that receives the parameter designation from the function validation model;

a parameter selection means that selects parameters related to the designated parameter; and a parameter display means that displays the parameters selected by the parameter selection means in an order of a degree of influence of component specification change if the designated parameter relates to the component specification change.

9. The design support system according to claim 8, wherein:

the function nodes include validation item data regarding the functions; and the display unit presents a list of included validation item data regarding the selected function nodes.

10. The design support system according to claim 8, wherein the node selecting means has a capability to select all nodes over hierarchical layers or select all nodes in each of the hierarchical layers.

11. The design support system according to claim 8, further comprising:

a validation record data storage means that stores validation record data which makes a relation with the function nodes;

a validation record data selection means that selects validation record data regarding a node to which a designation is given; and a validation record data display means that displays the validation record data.

12. The design support system according to claim 8, further comprising:

a failure case data storage means that stores failure case data related to the function node;

a failure case data selecting means that selects failure case data regarding a node to which a designation is given; and a failure case data display means that displays the failure case data.

13. The design support system according to claim 12, wherein said failure case data selecting means selects failure case data related to failure case data in a lower hierarchical layer than a node to which a designation is given.

14. The design support system according to claim 8, wherein the part node has one or plural design parameters and hierarchical layers of the part nodes and the function nodes are constructed with parameters.

15. A design support system, comprising:

a node data storage means that stores node data, including a group of function nodes which include nodes representing functions performed by an apparatus to be designed, the functions being subdivided from upper functions to lower functions, wherein each of the function nodes includes one or plural operation parameters and target specification parameters, and a group of part nodes which include part nodes representing parts for realizing the functions, wherein each of the part nodes includes one or plural design parameters;

a functional model generating means that generates a functional model in which the upper functions, the lower functions, and the parts are associated with one another and are hierarchized with reference to the node data stored in the node data storage means;

a node designation receiving means that receives the designation of a node among the functional models;

a node selection means that:

selects, if the designated node is one of the part nodes, at least one of the function nodes associated with the designated part node in an upper hierarchical level than the designated part node; and selects, if the designated node is one of the function nodes, at least one of the function nodes and the part nodes associated with the designated function node in an upper or lower hierarchical level than the designated function node;

a display unit that displays the at least one node selected by the node selection means;

a parameter relation information storage means which stores parameter relation information that defines a pairing of the parameters;

a function validation model generation means that generates a function validation model that shows a relation among parameters included in the node by referring to the parameter relation information storage means;

a parameter designation receiving means that receives the parameter designation from the function validation model;

a parameter selection means that selects parameters related to the designated parameter;

a parameter display means that displays the selected parameters selected by the parameter selection means;

a retrieving kind judgment means that judges a retrieving kind based on whether the designated parameter relates to an apparent specification change or a component specification change; and a presentation data processor that changes a display of a retrieving result in accordance with the retrieving kind which is judged by the retrieving kind judgment means, wherein the presentation data processor:

displays the parameters selected by the parameter selection means in an order of importance of a specification in the parameter display means if the retrieving kind is a change in the apparent specification; and displays the parameters selected by the parameter selection means in an order of a degree of influence of a component specification change if the retrieving kind is the component specification change.

16. The design support system according to claim 15, wherein:

the function nodes include validation item data regarding the functions; and the display unit presents a list of included validation item data regarding the selected function nodes.

17. The design support system according to claim 15, wherein the node selecting means has a capability to select all nodes over hierarchical layers or select all nodes in each of the hierarchical layers.

18. The design support system according to claim 15, further comprising:

a validation record data storage means that stores validation record data which makes a relation with the function nodes;

a validation record data selection means that selects validation record data regarding a node to which a designation is given; and a validation record data display means that displays the validation record data.

19. The design support system according to claim 15, further comprising:

a failure case data storage means that stores failure case data related to the function node;

a failure case data selecting means that selects failure case data regarding a node to which a designation is given; and a failure case data display means that displays the failure case data.

20. The design support system according to claim 15, wherein the part node has one or plural design parameters and hierarchical layers of the part nodes and the function nodes are constructed with parameters to be used for design.

* * * * *